(12) United States Patent
Shimada et al.

(10) Patent No.: US 8,076,720 B2
(45) Date of Patent: Dec. 13, 2011

(54) TRENCH GATE TYPE TRANSISTOR

(75) Inventors: Satoru Shimada, Gifu (JP); Yoshikazu Yamaoka, Gifu (JP); Kazunori Fujita, Gifu (JP); Tomonori Tabe, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 232 days.

(21) Appl. No.: 12/447,817

(22) PCT Filed: Sep. 26, 2008

(86) PCT No.: PCT/JP2008/068115
§ 371 (c)(1),
(2), (4) Date: Apr. 29, 2009

(87) PCT Pub. No.: WO2009/041742
PCT Pub. Date: Apr. 2, 2009

(65) Prior Publication Data
US 2010/0102382 A1    Apr. 29, 2010

(30) Foreign Application Priority Data

Sep. 28, 2007  (JP) ................................. 2007-255089
Sep. 28, 2007  (JP) ................................. 2007-255090

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/330; 257/E21.41; 438/270

(58) Field of Classification Search .................. 257/330, 257/E21.41, E29.262; 438/270
See application file for complete search history.

(56) References Cited

U.S. PATENT DOCUMENTS 5,321,289 A * 6/1994 Baba et al. .................... 257/331
6,291,298 B1  9/2001 Williams et al.
(Continued)

FOREIGN PATENT DOCUMENTS
CN          101138093 A     3/2008
(Continued)

OTHER PUBLICATIONS

International Search Report, mailed Dec. 22, 2008, directed to counterpart International Patent Application No. PCT/JP2008/068115; 3 pages.

(Continued)

*Primary Examiner* — Phuc Dang
(74) *Attorney, Agent, or Firm* — Morrison & Foerster LLP

(57) ABSTRACT

The invention provides a trench gate type transistor in which the gate leakage current is prevented and the gate capacitance is reduced. A trench is formed in an N– type semiconductor layer. A thin silicon oxide film is formed on a region of the N– type semiconductor layer for the active region of the transistor in the trench. On the other hand, a silicon oxide film which is thicker than the silicon oxide film is formed on a region not for the active region. Furthermore, a leading portion extending from inside the trench onto the outside thereof forms a gate electrode contacting the silicon oxide film. This provides a long distance between the gate electrode at the leading portion and the corner portion of the N– type semiconductor layer, thereby preventing the gate leakage current and reducing the gate capacitance.

9 Claims, 48 Drawing Sheets

U.S. PATENT DOCUMENTS

| | | | |
|---|---|---|---|
| 6,365,932 B1 * | 4/2002 | Kouno et al. | 257/341 |
| 2003/0089946 A1 | 5/2003 | Hshieh et al. | |
| 2004/0188803 A1 * | 9/2004 | Matsuda | 257/565 |
| 2007/0290260 A1 | 12/2007 | Adan | |
| 2009/0078995 A1 * | 3/2009 | Nakagawa et al. | 257/330 |
| 2010/0059816 A1 | 3/2010 | Shimada et al. | |

FOREIGN PATENT DOCUMENTS

| | | |
|---|---|---|
| JP | 9-283535 A | 10/1997 |
| JP | 2001-015733 A | 1/2001 |
| JP | 2001-358338 | 12/2001 |
| JP | 2003-509836 | 3/2003 |
| JP | 2003-188379 A | 7/2003 |
| JP | 2004-055659 A | 2/2004 |
| JP | 2005-510087 | 4/2005 |
| JP | 2005-322949 A | 11/2005 |
| JP | 2006-344760 A | 12/2006 |
| WO | WO-03/044865 A1 | 5/2003 |
| WO | WO-2006/132284 A1 | 12/2006 |

OTHER PUBLICATIONS

International Search Report, mailed Sep. 5, 2006, directed to a related International Patent Application No. PCT/JP2008/068116; 6 pages.

Shimada, S. et al., U.S. Office Action mailed Jun. 9, 2011, directed to U.S. Appl. No. 12/447,820; 7 pages.

* cited by examiner

TRENCH GATE TYPE TRANSISTOR

REFERENCE TO RELATED APPLICATIONS

This application is a national stage application under 35 USC 371 of International Application No. PCT/JP2008/068115, filed Sep. 26, 2008, which claims priority from Japanese Patent Application Nos. 2007-255089 and 2007-255090, both filed Sep. 28, 2007, the contents of which are incorporated herein by reference.

BACKGROUND OF THE INVENTION

1. Field of the Invention

The invention relates to a trench gate type transistor and a method of manufacturing the same.

2. Description of the Related Art

A DMOS transistor is a double-diffused MOS field effect transistor and used as a power semiconductor device for a power supply circuit, a driver circuit or the like. A trench gate type transistor is known as a type of DMOS transistor.

This trench gate type transistor is configured by forming a gate oxide film 215 in a trench 214 formed in a semiconductor layer 212 and forming a gate electrode 216 covering the gate oxide film 215 in the trench 214 as shown in FIG. 48. A body layer and a source layer (not shown) are further formed in the front surface of the semiconductor layer 212 on the sidewall of the trench 214 by double-diffusion in the vertical direction.

A trench gate type transistor is described in Japanese Patent Application Publication Nos. 2005-322949 and 2003-188379.

As shown in FIG. 48, however, at a portion 216S where the gate electrode 216 is led from inside the trench 214 to the outside (hereafter, referred to as a leading portion), there is a problem that leakage current (hereafter, referred to as gate leakage current) occurs between the gate electrode 216 and the semiconductor layer 212. According to the examination by the inventors, this is firstly because the gate oxide film 215 is thin, and secondly because a corner portion 212C of the semiconductor layer 212 faces the gate electrode 216 at the leading portion 216S with the thin gate oxide film 215 being therebetween and thus electric field concentration occurs in this portion.

SUMMARY OF THE INVENTION

The invention provides a trench gate type transistor including a semiconductor layer, a gate insulation film formed in a trench formed in the semiconductor layer and extending onto the semiconductor layer on an outside of the trench, a gate electrode formed on the gate insulation film, and a body layer formed in the semiconductor layer near its front surface and contacting the gate insulation film on a sidewall of the trench, the gate insulation film including a first gate insulation film having a first thickness in a portion contacting the body layer, and a second gate insulation film having a second thickness larger than the first thickness in a portion extending from inside the trench onto the semiconductor layer on the outside of the trench.

With this structure, since the second gate insulation film having the second thickness larger than the first thickness (the thick gate insulation film) is formed in a region extending from inside the trench onto the semiconductor layer on the outside of the trench, a long distance is provided between the gate electrode at the leading portion and the corner portion of the semiconductor layer. Therefore, the gate leakage current is prevented and the gate capacitance (of the gate electrode, the insulation film and the semiconductor layer) is reduced.

Furthermore, since the first gate insulation film having the first thickness (the thin gate insulation film) is formed in a region contacting the body layer (an active region), good transistor characteristics (low threshold, low on-resistance) is obtained.

The invention also provides a method of manufacturing a trench gate type transistor, including: forming a trench in a semiconductor layer; forming an oxide film on a front surface of the semiconductor layer including in the trench by thermally oxidizing the semiconductor layer formed with the trench; removing the oxide film on an active region in the trench selectively; forming a first gate oxide film having a first thickness on the active region in the trench and a second gate oxide film having a second thickness larger than the first thickness on a non-active region of the transistor by thermally oxidizing the semiconductor layer formed with the trench after the oxide film is selectively removed, forming a gate electrode on the first and second gate oxide films in the trench, extending onto the second gate oxide film on an outside of the trench; and forming a body layer on a sidewall of the trench so as to contact the first gate oxide film.

With this structure, since the first gate oxide film (the thin gate oxide film) is formed on the active region and the second gate oxide film (the thick gate oxide film) is formed on the non-active region, the same effect as described above is obtained.

The invention also provides a trench gate type transistor including: a semiconductor layer; a gate insulation film formed in a trench formed in the semiconductor layer; a thick insulation film formed in an end portion of the trench so as to contact the gate insulation film and having a thickness larger than the gate insulation film; a gate electrode covering the gate insulation film in the trench and extending onto the thick insulation film; and a body layer formed in the semiconductor layer near its front surface and contacting the gate insulation film on a sidewall of the trench.

With this structure, since the formation of the thick insulation film provides a long distance between the gate electrode at the leading portion and the corner portion of the semiconductor layer, the gate leakage current is prevented and the gate capacitance (of the gate electrode, the insulation film and the semiconductor layer) is reduced.

The invention also provides a method of manufacturing a trench gate type transistor, including: forming a trench having short sides and long sides in a front surface of a semiconductor layer; implanting impurities in the semiconductor layer on a sidewall and a bottom surface of the trench and in a front surface of a semiconductor substrate near the trench by obliquely ion-implanting the impurities in the long side direction of the trench as a first ion-implantation step; implanting impurities in the semiconductor layer on an upper portion of the sidewall of the trench and in the front surface of the semiconductor substrate near the trench by obliquely ion-implanting the impurities in the short side direction of the trench as a second ion-implantation step; forming a thick gate insulation film by accelerated oxidation in the portion where the impurities are implanted by the first and second ion-implantation steps; and forming a gate electrode from inside the trench onto the semiconductor layer on the outside of the trench with the thick gate insulation film formed by the accelerated oxidation being interposed therebetween.

With this structure, since the thick gate insulation film is formed by the accelerated oxidation with the implantation of the impurities, a long distance is provided between the gate electrode at the leading portion and the corner portion of the semiconductor layer. Therefore, the gate leakage current is prevented and the gate capacitance (of the gate electrode, the insulation film and the semiconductor layer) is reduced.

The trench gate type transistor and the method of manufacturing the same of the invention prevent the gate leakage current and reduce the gate capacitance. Furthermore, good transistor characteristics (low threshold, low on-resistance) are obtained.

DETAILED DESCRIPTION OF THE INVENTION

First Embodiment

Figure 1:
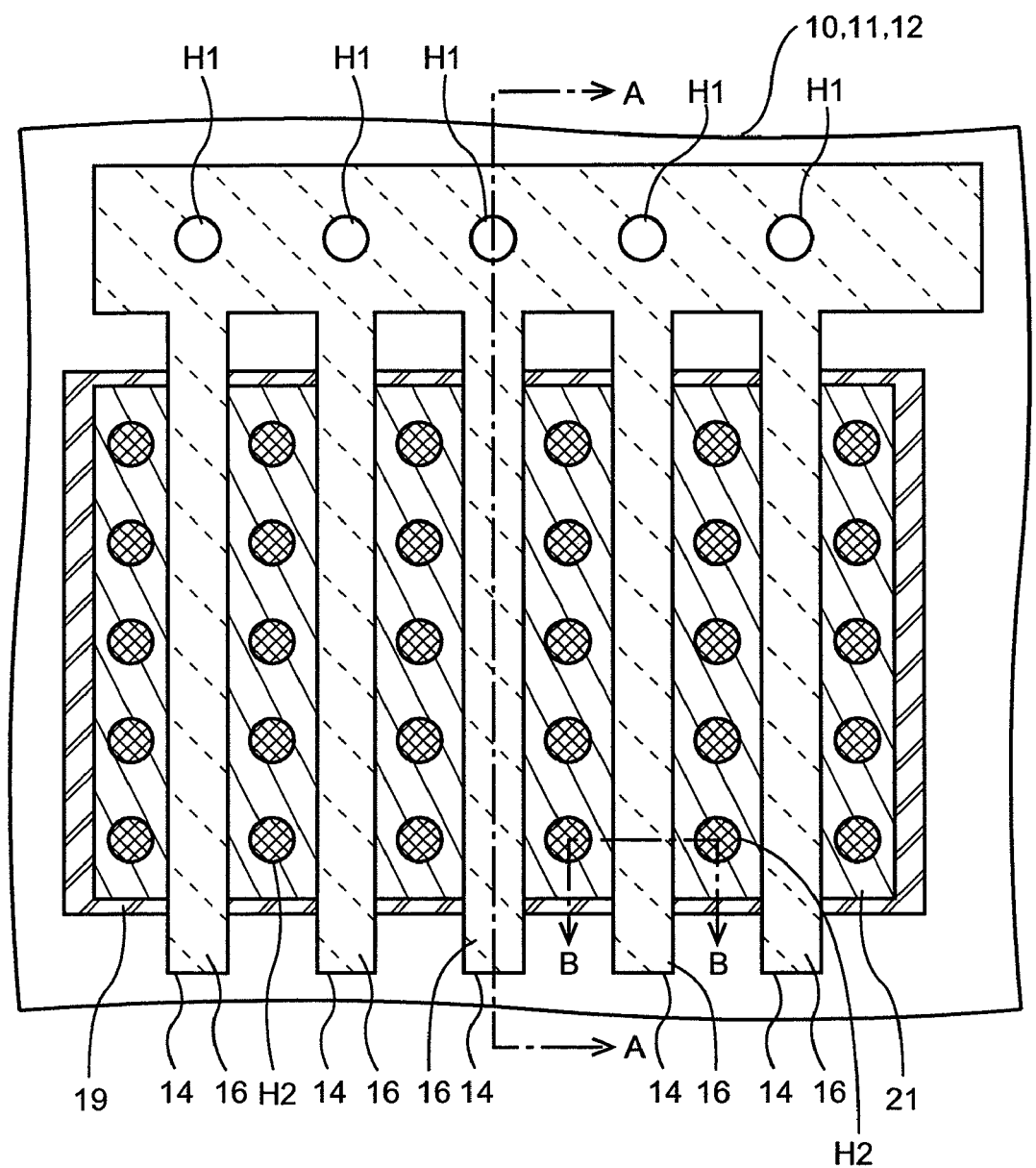
FIGS. 1 and 13 are plan views for explaining a trench gate type transistor and a method of manufacturing the same of a first embodiment of the invention.
Figure 2A:
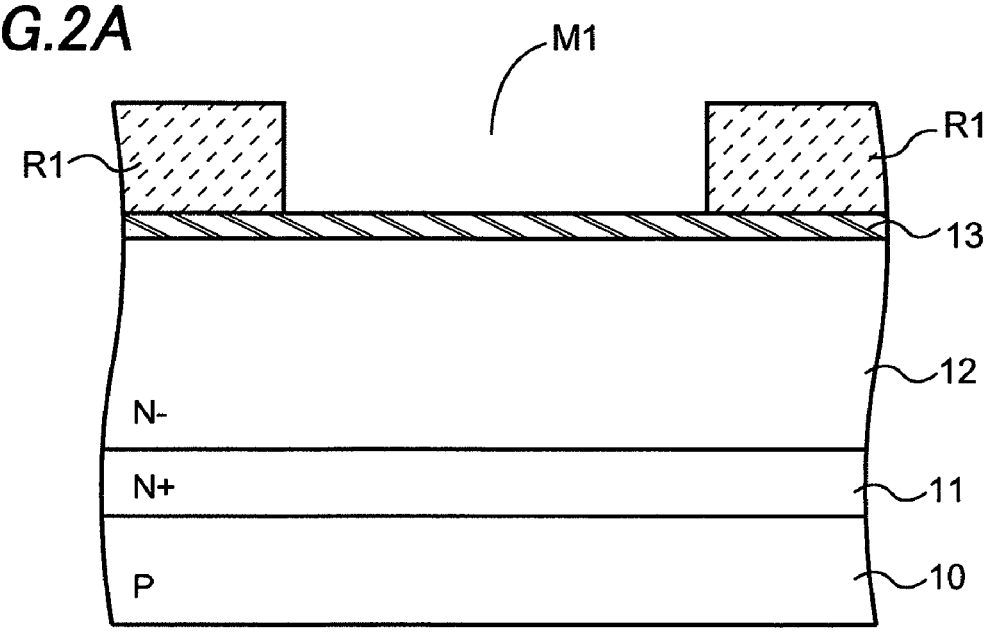
FIGS. 2 to 12 are cross-sectional views for explaining the trench gate type transistor and the method of manufacturing the same of the first embodiment of the invention.
Figure 2B:
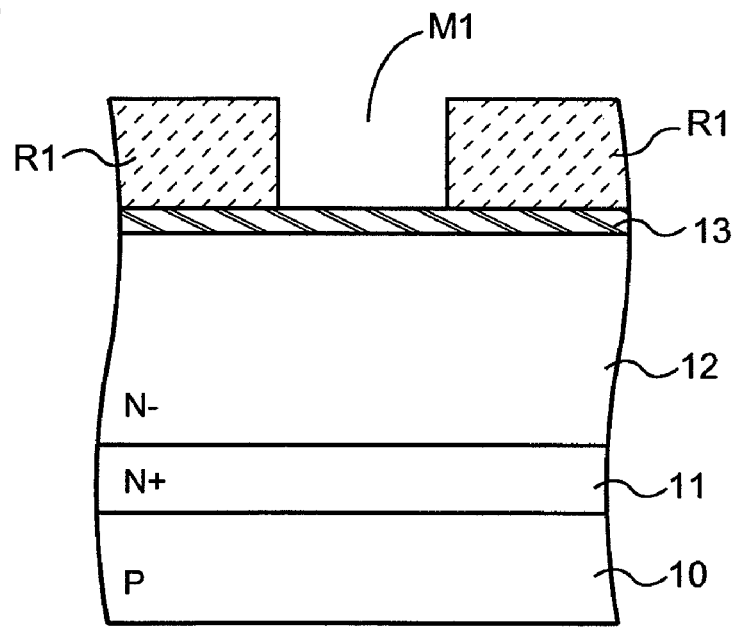

A first embodiment of the invention will be described referring to figures. FIG. 1 is a plan view for explaining a trench gate type transistor and a method of manufacturing the same of the embodiment of the invention. FIGS. 2(A) to 11(A) are cross-sectional views of FIG. 1 along line A-A, and FIGS. 2(B) to 11(B) are cross-sectional views of FIG. 1 along line B-B. In the following description, the trench gate type transistor is referred to as a transistor simply.

First, the schematic plan structure of the transistor of the embodiment will be described referring to FIG. 1. Here, only main elements will be described. In this transistor, an N+ type semiconductor layer 11 and an N− type semiconductor layer 12 are formed on a P type semiconductor substrate 10, and a plurality of trenches 14 each having short sides and long sides is formed in the N− type semiconductor layer 12 on the front surface side through a region where a body layer 19 is formed. A gate electrode 16 is formed in each of the trenches 14 with a gate insulation film (not shown) being interposed therebetween. The gate electrodes 16 are connected to each other in one ends of the trenches 14, extending onto the outside of the trenches 14. The gate electrodes 16 extending onto the outside of the trenches 14 are connected to wires (not shown) through contact holes H1 provided in an interlayer insulation film (not shown).

It is noted that other high breakdown voltage MOS transistor (not shown) may be formed on the same N− type semiconductor layer 12 near this transistor.

Hereafter, the trench gate type transistor and the method of manufacturing the same of the embodiment will be described referring to figures.

As shown in FIG. 2, the N+ type semiconductor layer 11 and the N− type semiconductor layer 12 are formed by doping N type impurities in the front surface of the P type semiconductor substrate 10 and then epitaxially growing the semiconductor layers. Hereafter, the description is given supposing that the semiconductor substrate 10 is of a silicon single crystal substrate and the N+ type semiconductor layer 11 and the N− type semiconductor layer 12 are of a silicon single crystal semiconductor layer, but the invention is not limited to this. Then, a silicon oxide film 13 is formed on the N− type semiconductor layer 12 by a CVD method or a thermal oxidation treatment. Furthermore, a resist layer R1 having an opening M1 is formed on the silicon oxide film 13. The opening M1 has a plurality of rectangles with short sides and long sides.

Figure 3A:
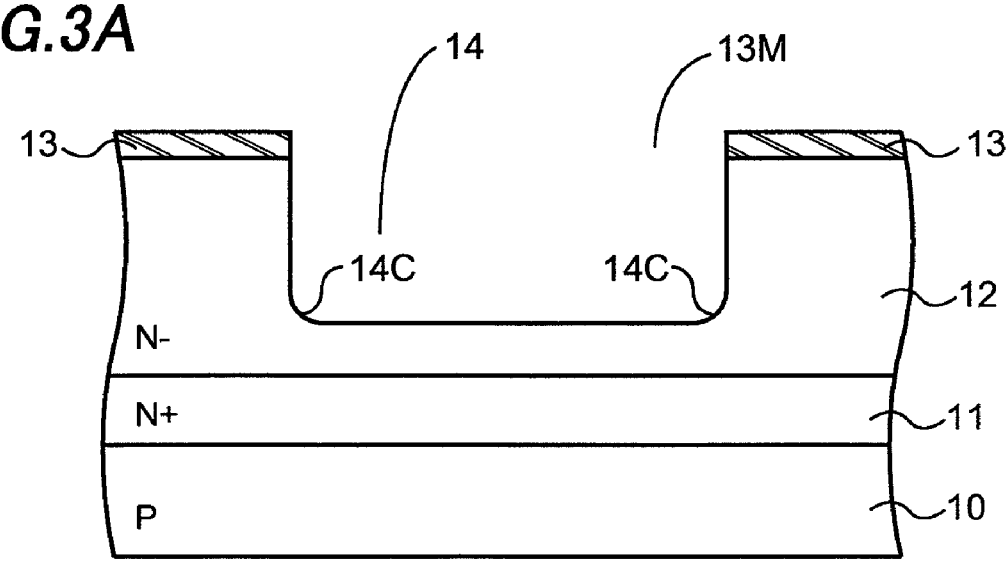
Figure 3B:
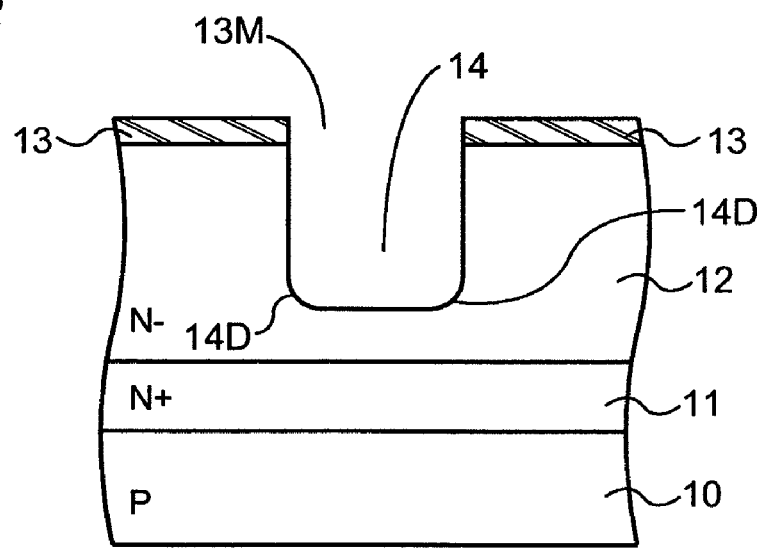

Then, as shown in FIG. 3, the silicon oxide film 13 is etched using the resist layer R1 as a mask to form an opening 13M in the silicon oxide film 13. After the resist layer R1 is removed, the N− type semiconductor layer 12 is etched using the silicon oxide film 13 as a hard mask to form the plurality of trenches 14 with short sides and long sides corresponding to the opening 13M. This etching is dry-etching using etching gas containing $SF_6$, for example. Therefore, the corner portions 14C and 14D at the bottoms of the trenches 14 are formed to be round. Preferably, the depth of the trench 14 is about 1 μm, the long side is about 50 μm, and the short side is about 0.5 μm. The number of the trenches 14 is preferably about ten. The silicon oxide film 13 is then removed.

Figure 4A:
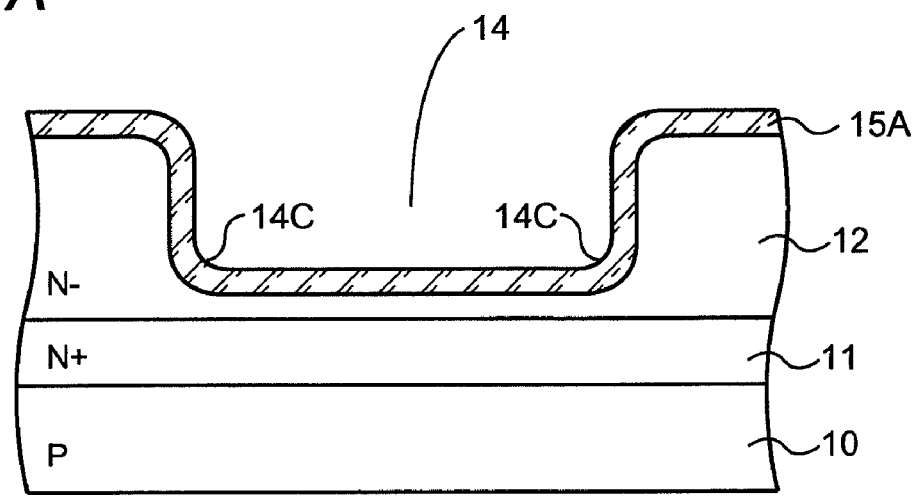
Figure 4B:
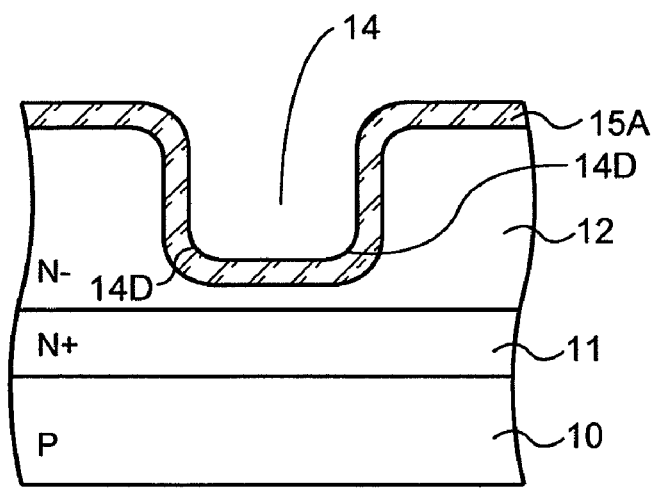

Then, as shown in FIG. 4, a thermal oxidation treatment is performed to the N− type semiconductor layer 12 in the trenches 14 to form a silicon oxide film 15A. Preferably, the thickness of the silicon oxide film 15A at this time is about 100 nm. The silicon oxide film 15A is formed to be round at the corner portions 14C and 14D at the bottoms of the trenches 14, reflecting the round shapes of these.

When other high breakdown voltage MOS transistor is formed on the same N− type semiconductor layer 12, the silicon oxide film 15A is formed simultaneously with the gate oxide film of this transistor. The thickness of the silicon oxide film 15A depends on the breakdown voltage characteristics of the MOS transistor.

Figure 5A:
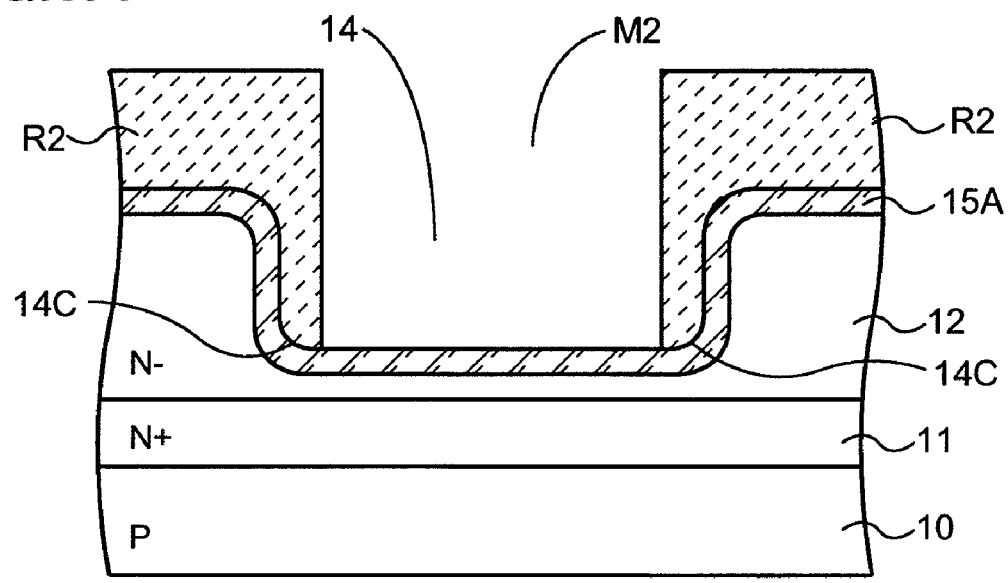
Figure 5B:
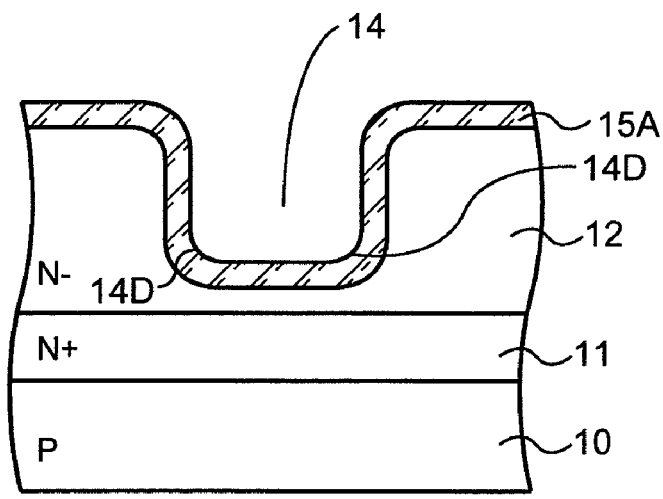

Then, as shown in FIG. 5, a resist layer R2 having an opening M2 is formed on the silicon oxide film 15A. The opening M2 is located on a region of the N− type semiconductor layer 12 for the active region of the transistor. The active region of the transistor is a region for forming the body layer 19. Hereafter, the active region of the transistor is referred to as an active region simply. In other words, the resist layer R2 extends on a region of the N− type semiconductor layer 12 not for the active region (a non-active region), i.e., from the corner portions 14C of the short sides of the trenches 14 onto the outside of the trenches 14.

Figure 6A:
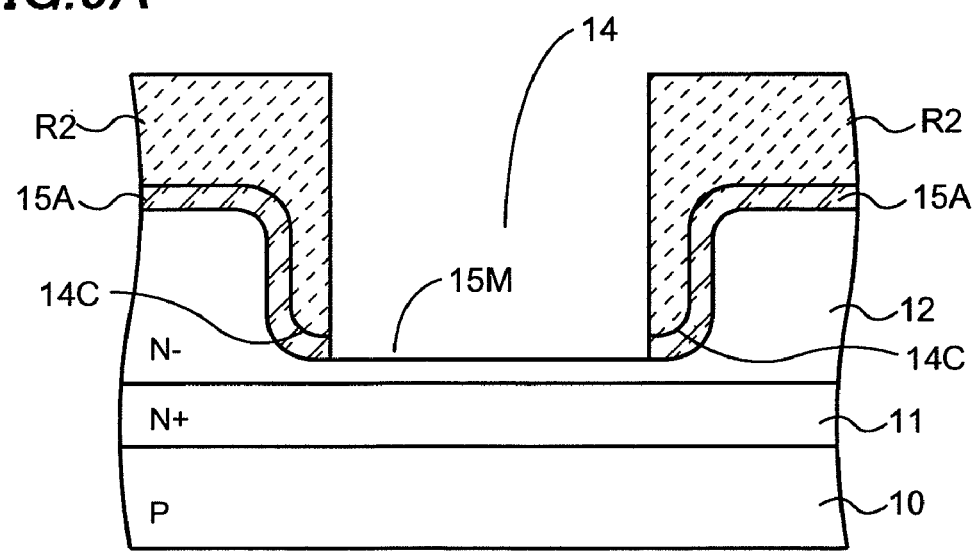
Figure 6B:
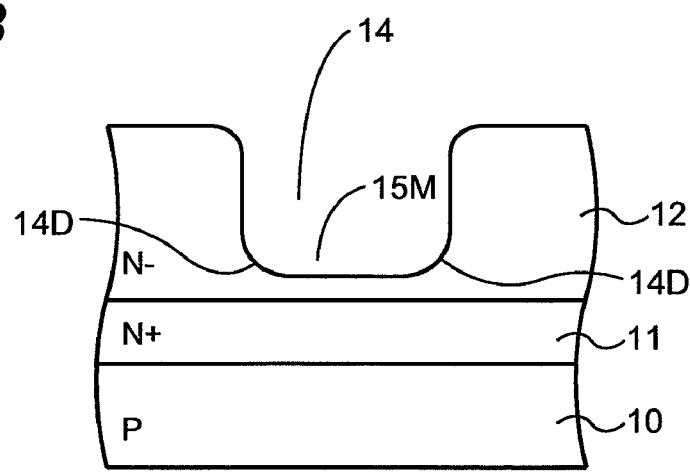

Then, as shown in FIG. 6, the silicon oxide film 15A is etched using the resist layer R2 as a mask. By this process, an opening 15M is formed exposing the region of the N− type semiconductor layer 12 for the active region. The resist layer R2 is then removed.

Figure 7A:
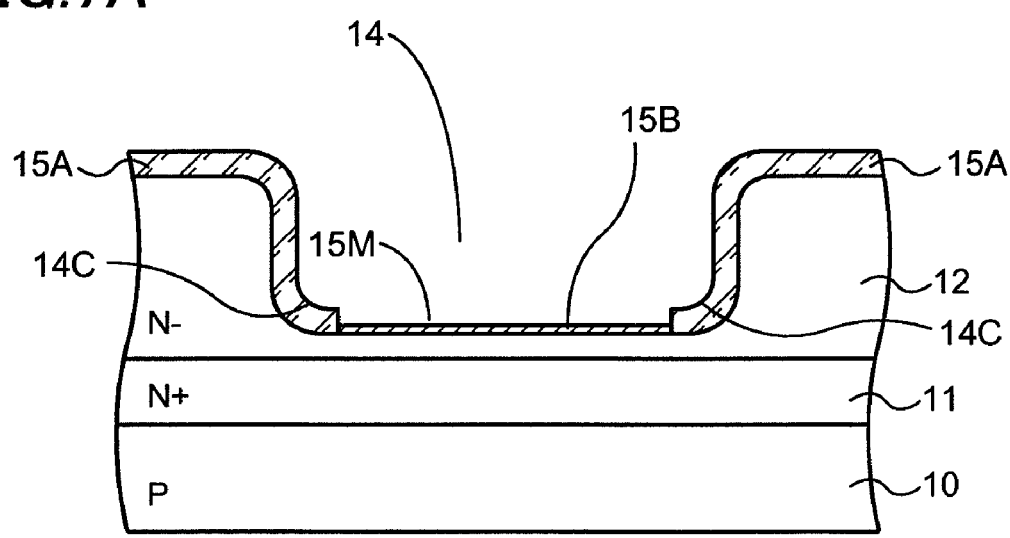
Figure 7B:
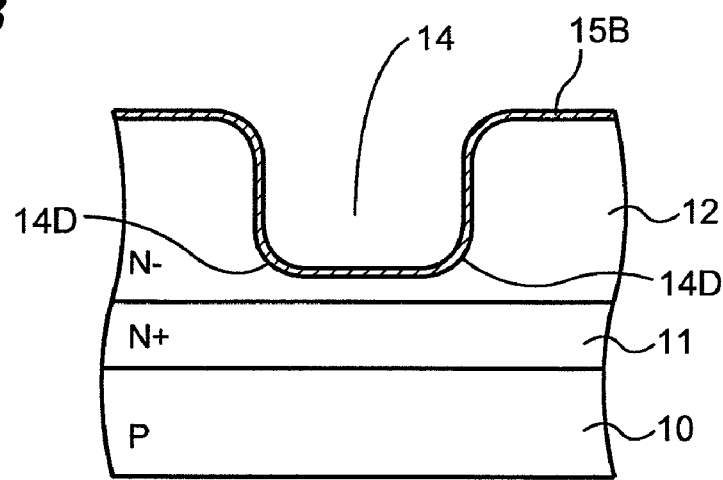

Then, as shown in FIG. 7, a thermal oxidation treatment is performed to the N− type semiconductor layer 12 exposed in the opening 15M of the silicon oxide film 15A in the trenches 14 to form a silicon oxide film 15B in this region.

The thin silicon oxide film 15B (an example of a first gate insulation film of the invention) is thus formed on the region of the N− type semiconductor layer 12 for the active region. Preferably, the thickness of the silicon oxide film 15B is about 10 nm.

On the other hand, the silicon oxide film 15A (an example of a second gate insulation film of the invention) which is thicker than the silicon oxide film 15B remains on the region not for the active regions (the non-active region). Preferably, the thickness of the silicon oxide film 15A is about 100 nm.

Figure 8A:
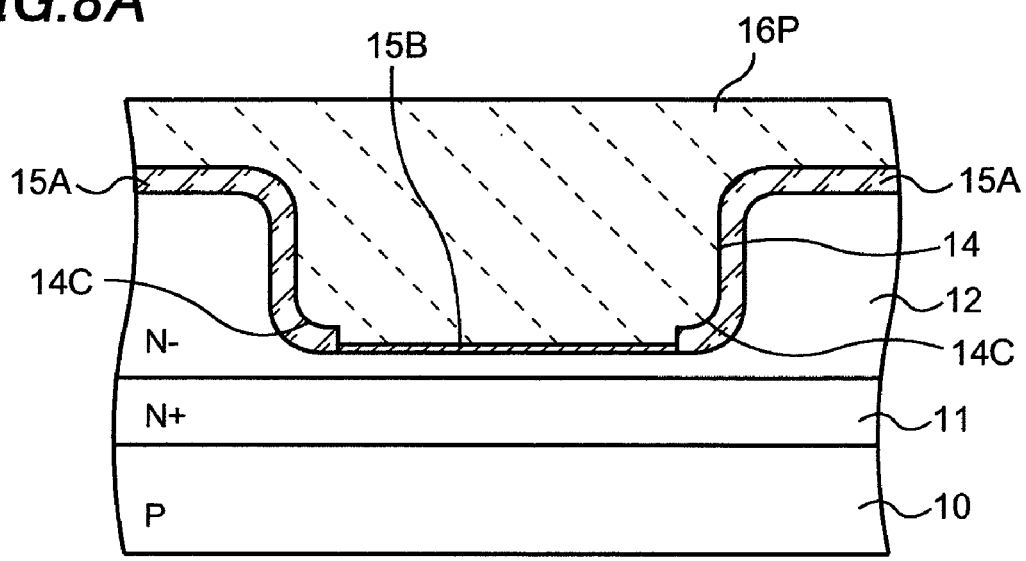
Figure 8B:
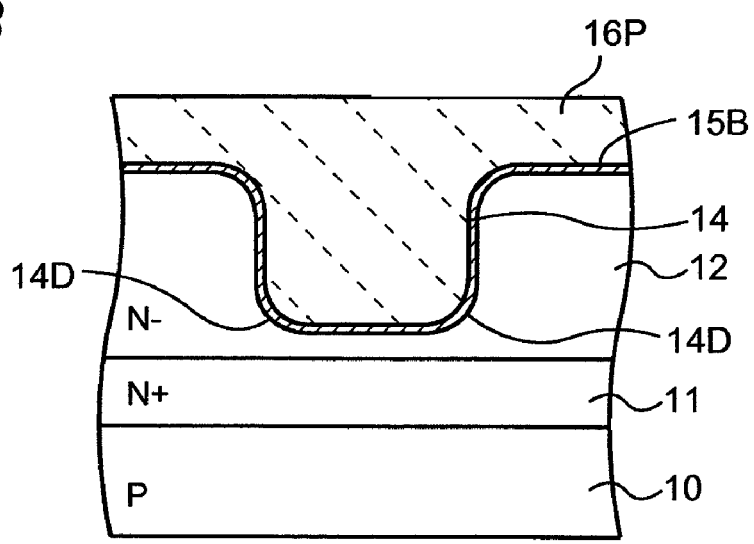

Then, as shown in FIG. 8, a polysilicon layer 16P is formed covering the silicon oxide film 15A and the silicon oxide film 15B, and impurities are doped therein. The impurities are preferably of an N type impurity.

Figure 9A:
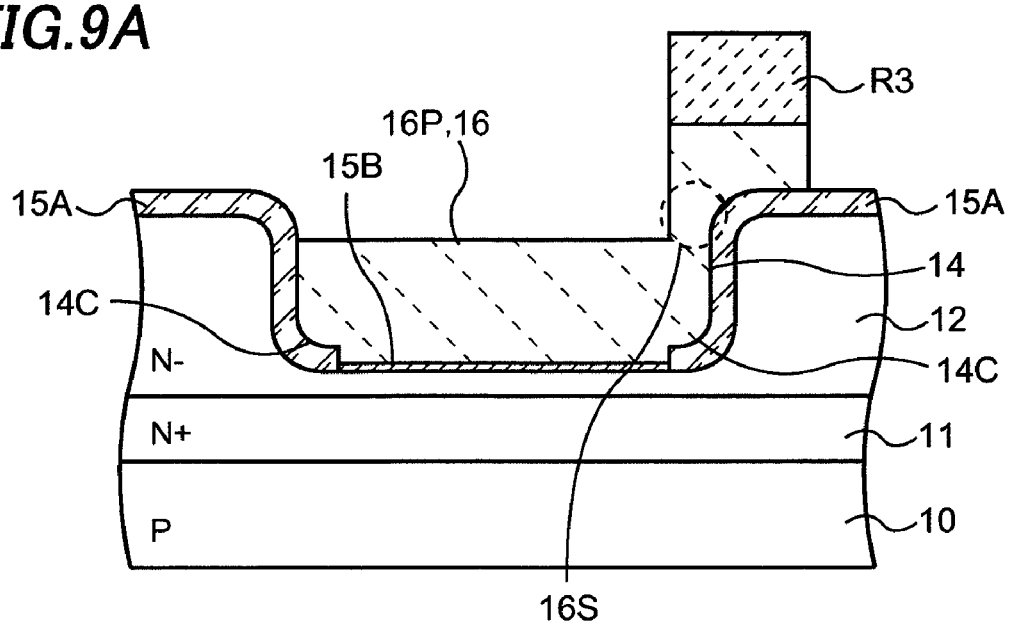
Figure 9B:
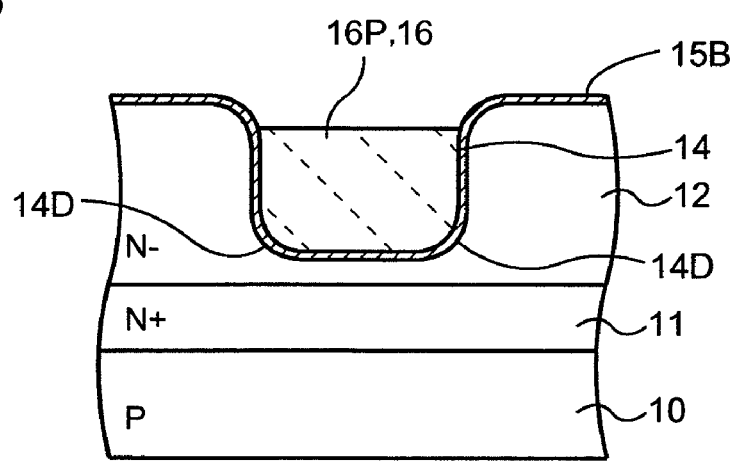

Then, as shown in FIG. 9, a resist layer R3 is formed on the polysilicon layer 16P in a region overlapping a part of the thick silicon oxide film 15A. Then, the polysilicon layer 16P is etched using the resist layer R3 as a mask to form the gate electrodes 16 extending from inside the trenches 14 onto the silicon oxide film 15A. Leading portions 16S of the gate electrodes 16 extending from inside the trenches 14 onto the outside contact the thick silicon oxide film 15A. Furthermore, the gate electrodes 16 are connected to each other on the silicon oxide film 15A on the outside of the trenches 14. This etching is plasma etching, for example. The resist layer R3 is then removed.

Figure 10A:
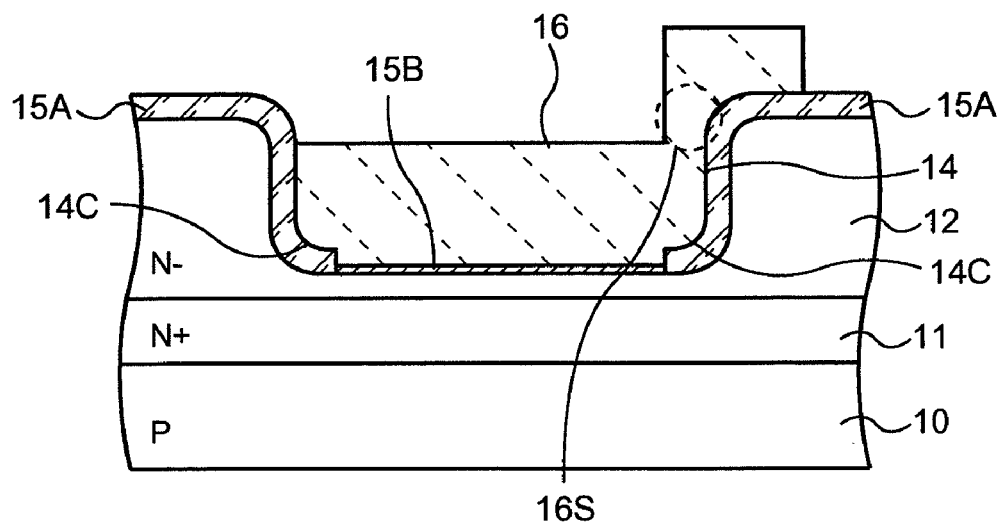
Figure 10B:
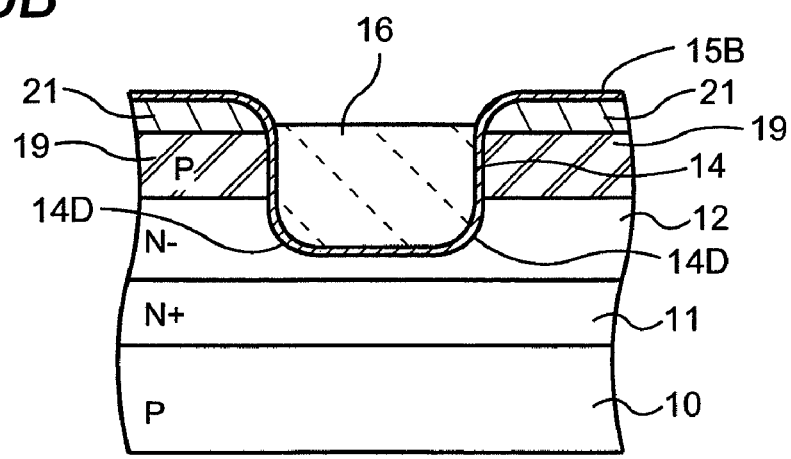
Figure 11A:
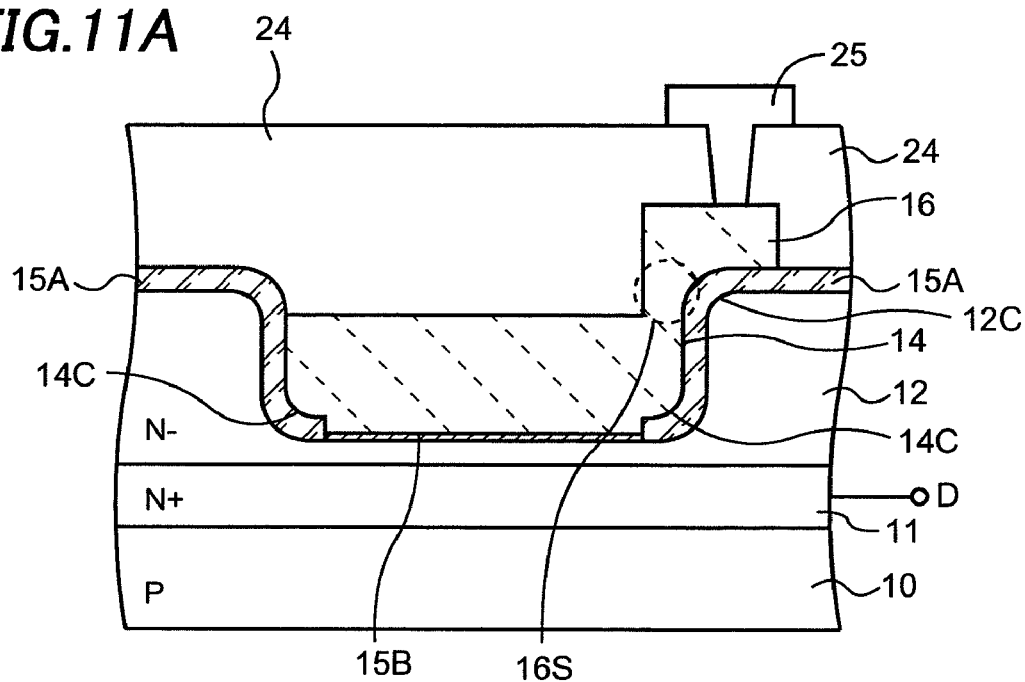
Figure 11B:
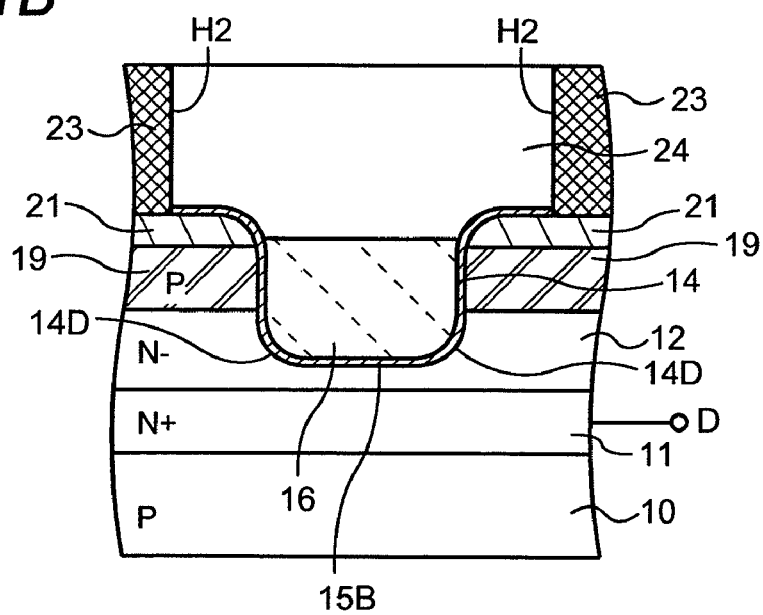

Then, as shown in FIG. 10, P type impurities are ion-implanted in the N− type semiconductor layer 12 around each of the trenches 14 in the vertical direction to form the P type body layer 19. This body layer 19 contacts the thin silicon oxide film 15B. Furthermore, N type impurities are ion-implanted in the front surface of the body layer 19 along the long sides of the trenches 14 to form a source layer 21. It is preferable to perform a heat treatment for the activation and the modulation of the impurity distributions of the body layer 19 and the source layer 21.

Then, as shown in FIG. 11, an interlayer insulation film 24 is formed covering the silicon oxide films 15A and 15B and the gate electrodes 16. Wiring layers 25 are formed on the interlayer insulation film 24, being connected to the gate electrodes 16 through the contact holes H1 provided in the interlayer insulation film 24. Furthermore, source electrodes 23 are formed on the interlayer insulation film 24, being connected to the source layer 21 through contact holes H2 provided in the silicon oxide film 15B and the interlayer insulation film 24.

In the transistor thus completed, when a potential of the threshold or more is applied from the wiring layers 25 to the gate electrodes 16, the surface of the body layer 19 on the sidewalls of the trenches 14 is inverted into the N type to form channels. Therefore, current flows between the source electrodes 23 and the N− type semiconductor layer 12 and the N+ type semiconductor layer 11 as a drain D.

Furthermore, since the silicon oxide film 15A contacting the leading portion 16S of the gate electrode 16 functions as a thick gate insulation film, a long distance is provided between the gate electrode 16 at the leading portion 16S and the corner portion 12C of the N− type semiconductor layer 12, the gate leakage current is prevented and the gate capacitance (of the gate electrode 16, the silicon oxide film 15A and the N− type semiconductor layer 12) is reduced.

Furthermore, since the thin silicon oxide film 15B is formed as the gate insulation film on the active region (the region formed with the body layer 19) of the transistor, good transistor characteristics (low threshold, low on-resistance) are obtained.

Figure 12:
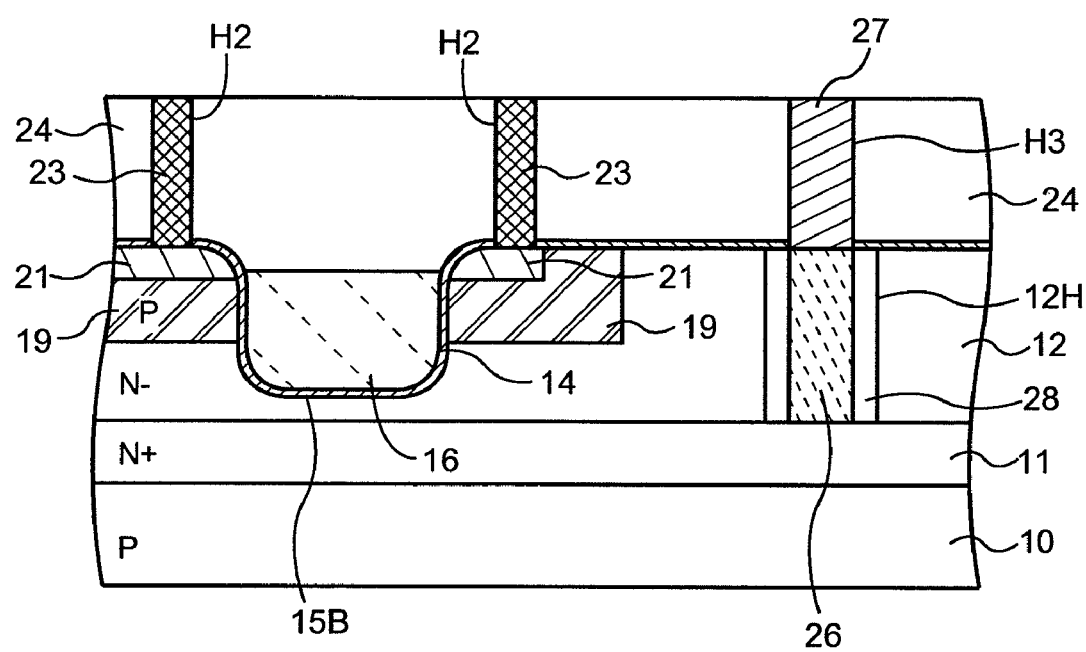

As a modification of the embodiment, as shown in FIG. 12, a drain leading portion 26 and a drain electrode 27 may be formed. In this case, before the interlayer insulation film 24 is formed, an opening 12H is formed in the N− type semiconductor layer 12, an insulation film 28 is formed in the opening 12H, and the drain leading portion 26 is embedded therein. Then, the interlayer insulation film 24 is formed, a penetration hole H3 is formed penetrating the interlayer insulation film 24, and the drain electrode 27 is formed in the penetration hole H3, being connected to the drain leading portion 26.

Figure 13:
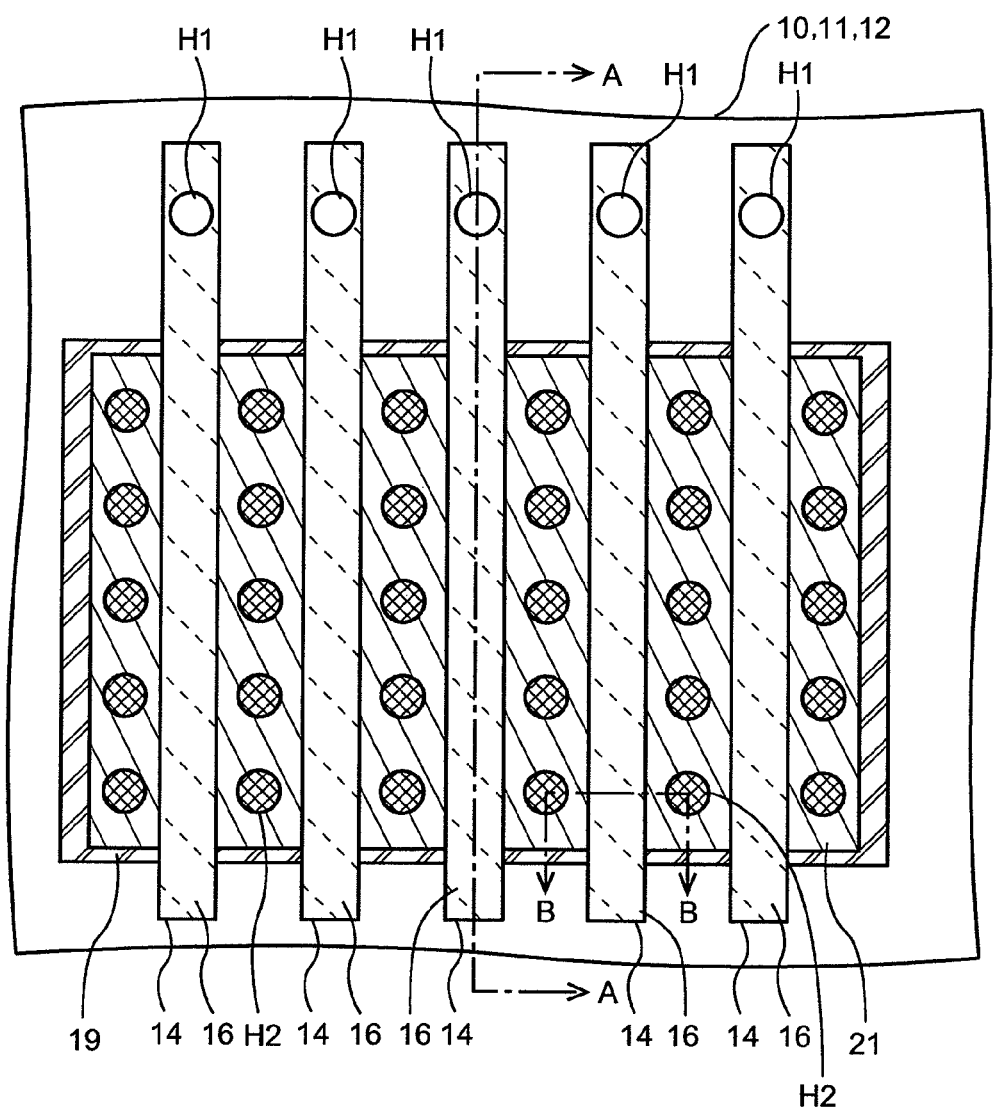

Furthermore, as other modification of the embodiment, the gate electrodes 16 may be formed separately and isolatedly in the ends of the trenches 14 respectively as shown in the plan view of FIG. 13 instead of being connected to each other in the ends of the trenches 14 as shown in FIG. 1. The other structure is the same as that of FIG. 1. With this structure, when the plasma etching is performed to etch the polysilicon layer 16P, since the area of the gate electrodes 16 made of the polysilicon layer 16P is reduced, plasma damage to the gate electrodes 16 is minimized. Therefore, the reliability of the transistor is enhanced.

Second Embodiment

Figure 14:
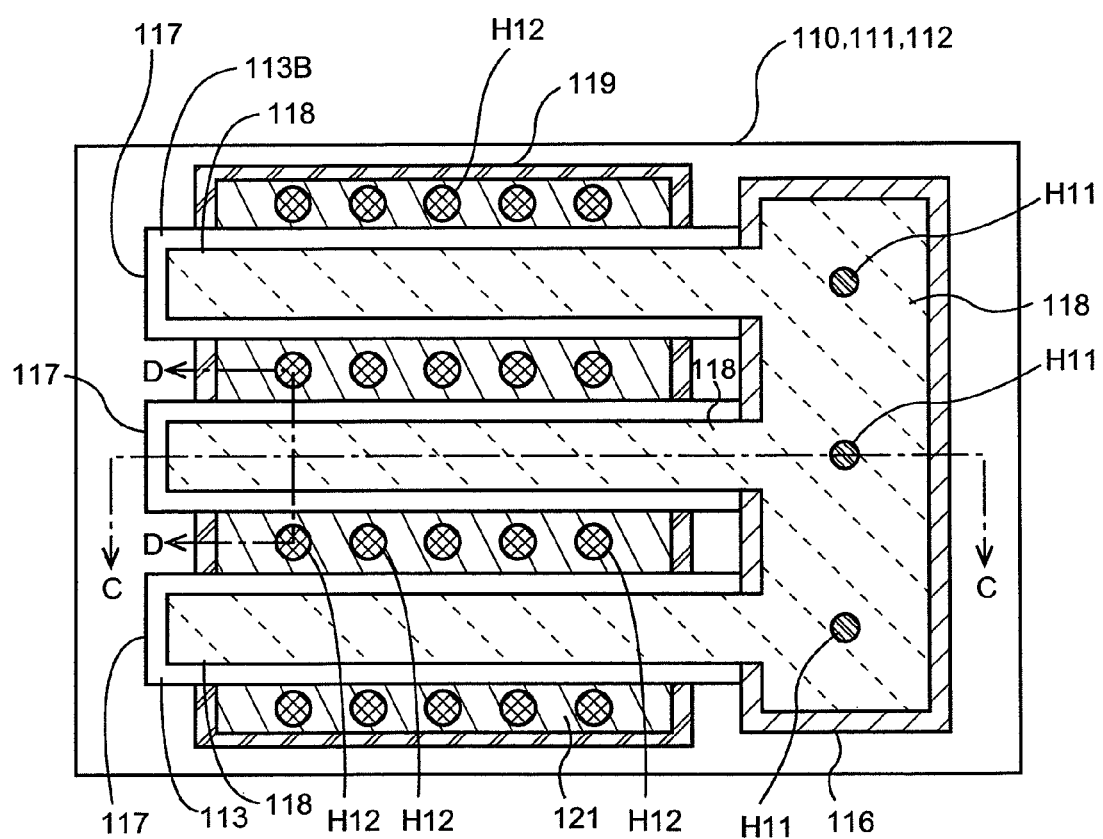
FIGS. 14, 28 and 29 are plan views for explaining a trench gate type transistor and a method of manufacturing the same of a second embodiment of the invention.
Figure 15A:
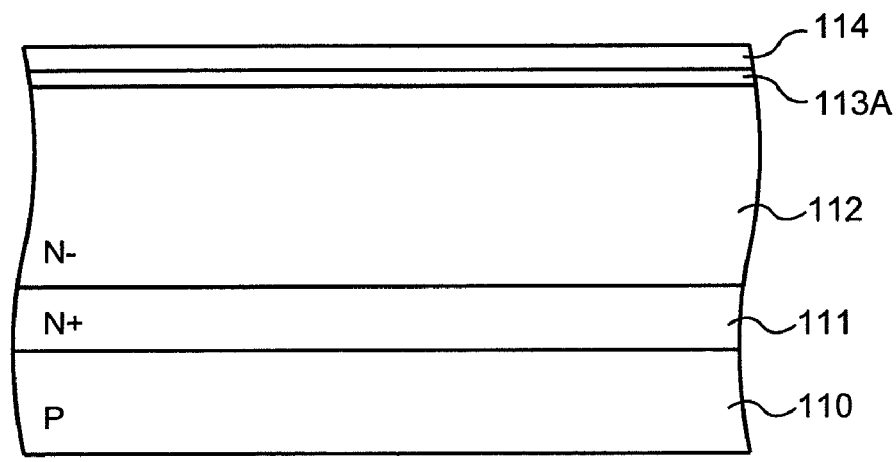
FIGS. 15 to 27 are cross-sectional views for explaining the trench gate type transistor and the method of manufacturing the same of the second embodiment of the invention.
Figure 15B:
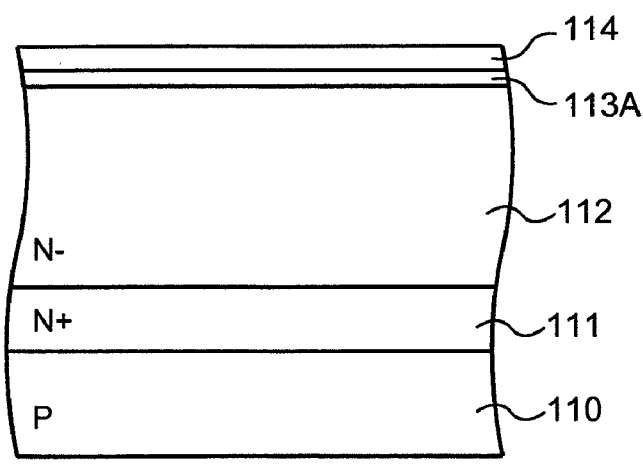

A second embodiment of the invention will be described referring to figures. FIG. 14 is a plan view for explaining a trench gate type transistor and a method of manufacturing the same of the second embodiment of the invention. FIGS. 15(A) to 26(A) are cross-sectional views of FIG. 14 along line C-C, and FIGS. 15(B) to 26(B) are cross-sectional views of FIG. 14 along line D-D. In the following description, the trench gate type transistor is referred to as a transistor simply.

As shown in FIG. 14 and FIG. 26, an N+ type semiconductor layer 111 and an N− type semiconductor layer 112 are formed on a P type semiconductor substrate 110, being laminated sequentially, and a plurality of trenches 117 is formed in the front surface of the N− type semiconductor layer 112. The following description is given supposing that the semiconductor substrate 110 is of a silicon single crystal substrate, but the invention is not limited to this.

A gate oxide film 113B is formed in the trenches 117, and a trench oxide film 116 (an example of a thick insulation film of the invention) is formed in the ends of the trenches 117, contacting the gate oxide film 113B. The trench oxide film 116 is thicker than the gate oxide film 113B. A gate electrode 118 is formed in each of the trenches 117, covering the gate oxide film 113B. The gate electrode 118 extends from the gate oxide film 113B in the trench 117 onto the trench oxide film 116. The gate electrode 118 extending onto the outside of the trench 117 is connected to a wiring layer 125 through a contact hole H11 provided in an interlayer insulation film 124. Furthermore, a body layer 119 and a source layer 121 are formed in the front surface of the N− type semiconductor layer 112, contacting the gate oxide film 113B on the sidewalls of the trenches 117. The source layer 121 is connected to source electrodes 123 through contact holes H12 provided in the gate oxide film 113B and the interlayer insulation film 124.

Since the thick trench oxide film 116 is thus formed at a leading portion of the gate electrode 118 in the trench 117, the gate leakage current is prevented and the gate capacitance is reduced.

Hereafter, the transistor and the method of manufacturing the same of the embodiment will be described referring to figures.

As shown in FIG. 15, the N+ type semiconductor layer 111 and the N− type semiconductor layer 112 are formed by doping N type impurities in the front surface of the P type semiconductor substrate 110 and then epitaxially growing the semiconductor layers. Hereafter, the description is given supposing that the semiconductor substrate 110 is of a silicon single crystal substrate and the N+ type semiconductor layer 111 and the N− type semiconductor layer 112 are of a silicon single crystal semiconductor layer, but the invention is not limited to this. Then, a silicon oxide film 113A and a silicon nitride film 114 are sequentially formed on the N− type semiconductor layer 112.

Figure 16A:
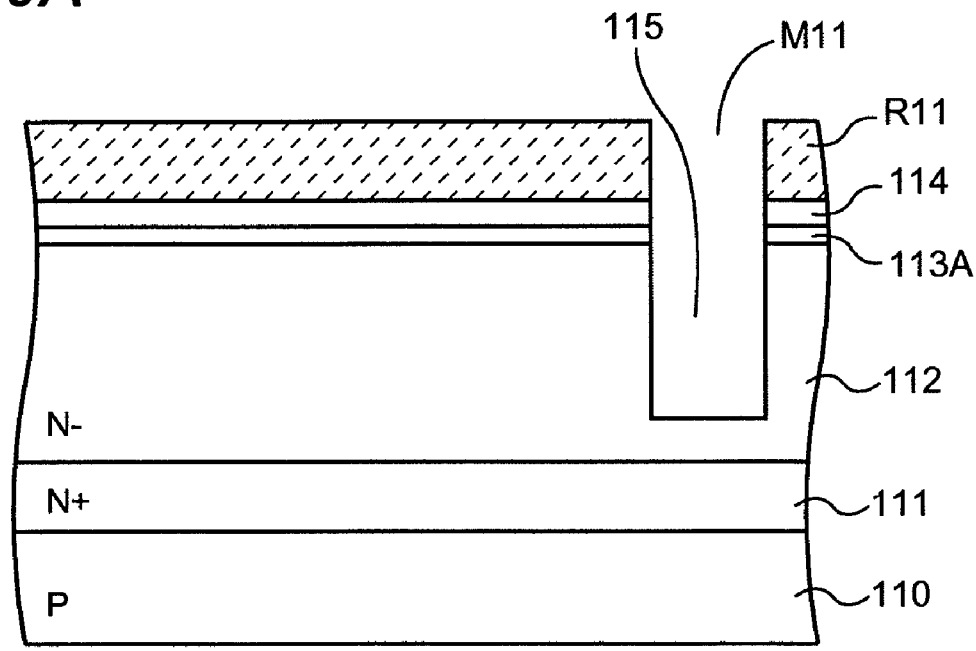
Figure 16B:
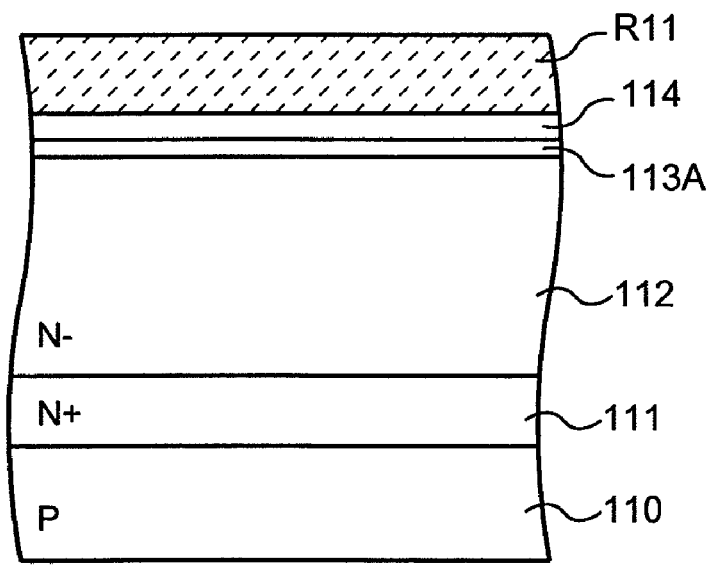

Then, as shown in FIG. 16, a resist layer R11 having an opening M11 is formed on the silicon nitride film 114. The silicon oxide film 113A, the silicon nitride film 114 and the N− type semiconductor layer 112 are then etched using this resist layer R11 as a mask to form a trench-shaped concave portion 115 in the N− type semiconductor layer 112. The resist layer R11 is then removed. In this etching, plasma etching using $Cl_2$ gas is preferable.

Figure 17A:
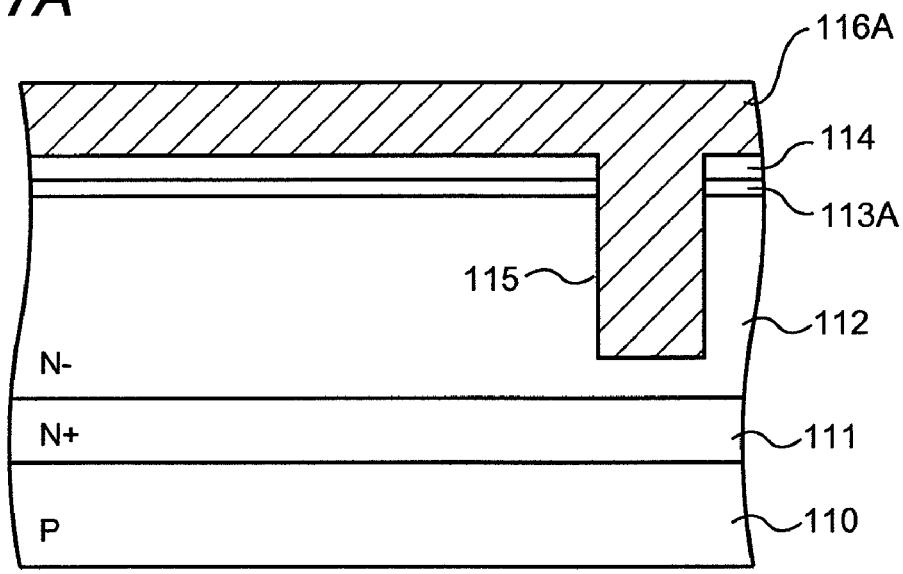
Figure 17B:
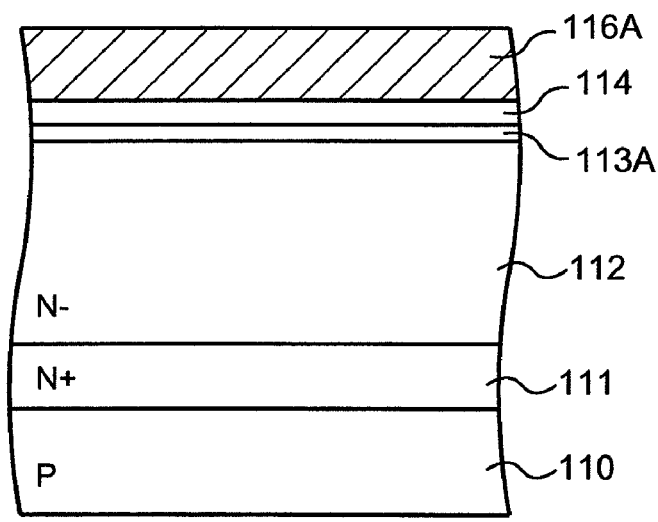
Figure 18A:
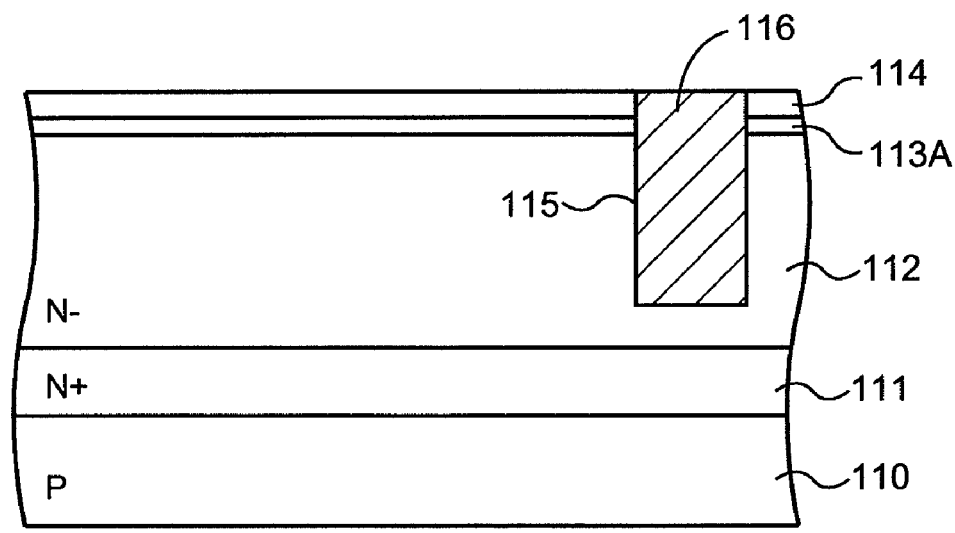
Figure 18B:
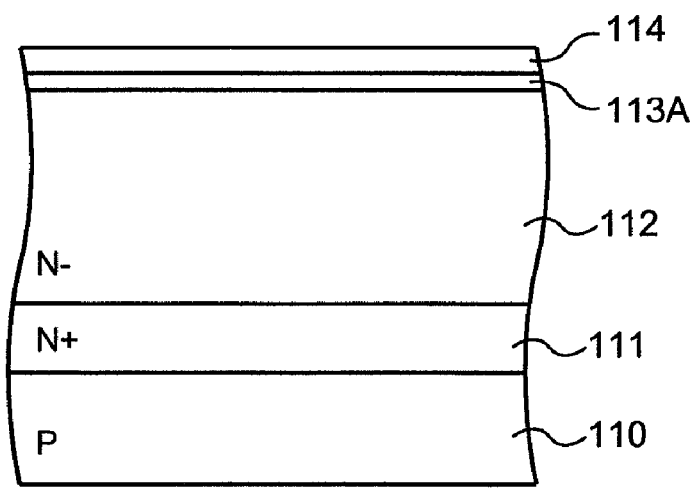

Then, as shown in FIG. 17, a silicon oxide film 116A is formed on the silicon nitride film 114 including inside the concave portion 115 by a CVD method. Then, as shown in FIG. 18, a CMP (Chemical Mechanical Etching) treatment is performed to the silicon oxide film 116A using the silicon nitride film 114 as an etching stopper. By this process, the silicon oxide film 116A is partially removed to be flush with the front surface of the silicon nitride film 114 and remains only in the concave portion 115 to form the trench oxide film 116.

Figure 19A:
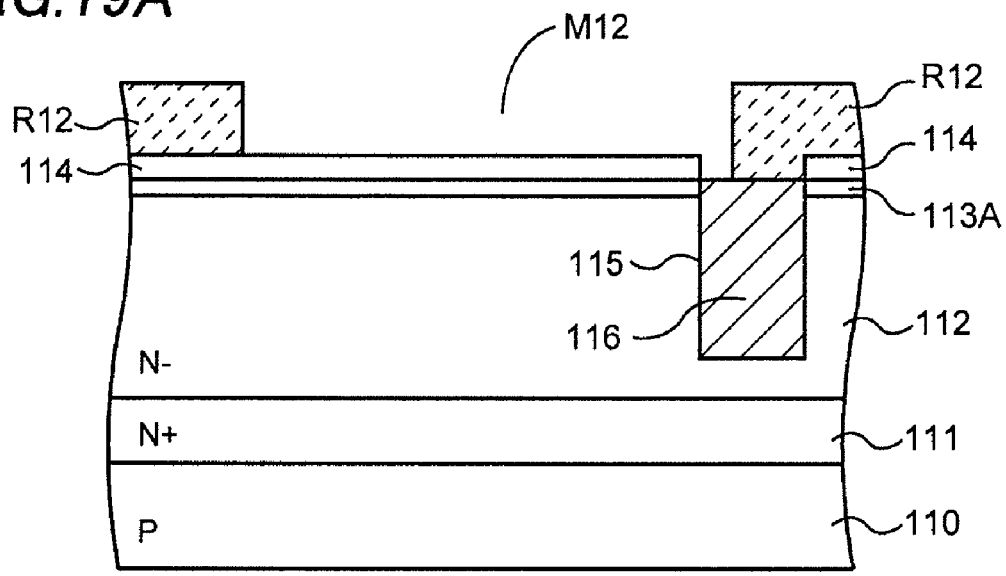
Figure 19B:
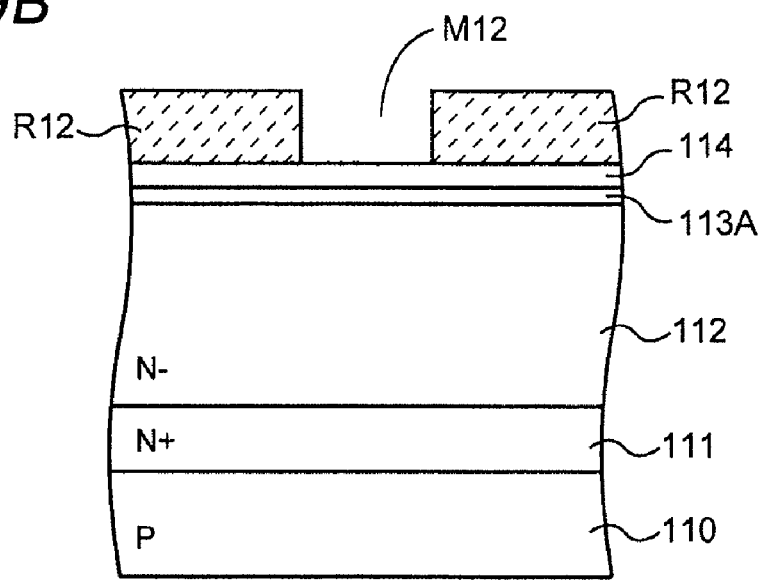

Then, as shown in FIG. 19, it is preferable for planarization that the trench oxide film 116 in the concave portion 115 is partially removed by wet etching to make its front surface flush with the front surface of the silicon oxide film 113A. A resist layer R12 having an opening M12 is then formed. The opening M12 includes a plurality of rectangles having short sides and long sides in its plan view. One end of the opening M12 is located on the trench oxide film 116.

Figure 20A:
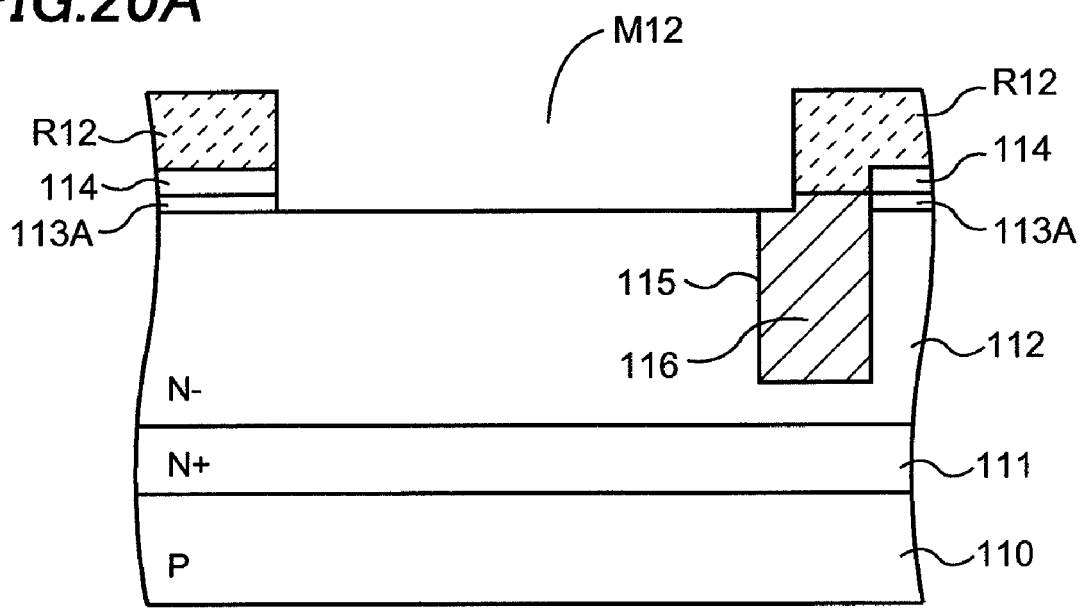
Figure 20B:
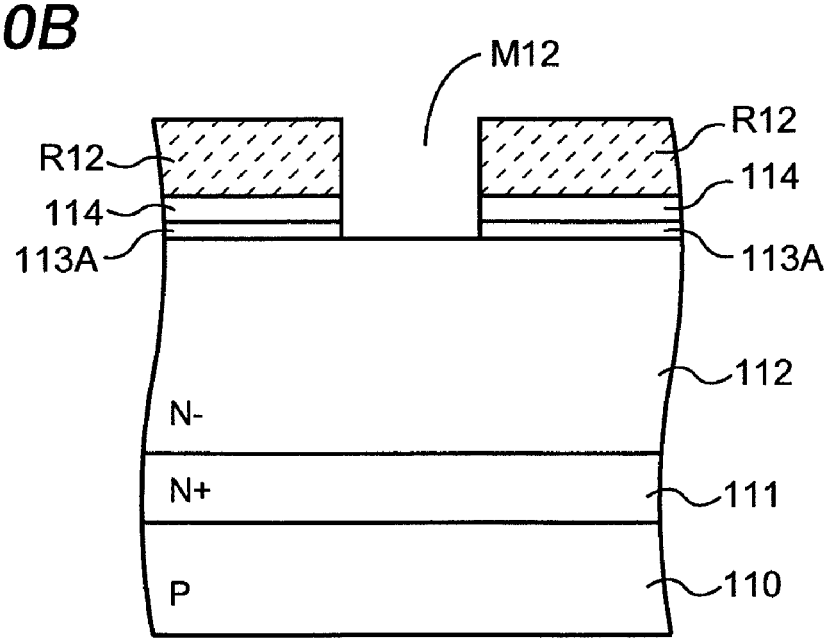

Then, as shown in FIG. 20, the silicon oxide film 113A and the silicon nitride film 114 in the opening M12 are etched and removed using the resist layer R12 as a mask. By this process, the N− type semiconductor layer 112 is exposed in the opening M12.

Figure 21A:
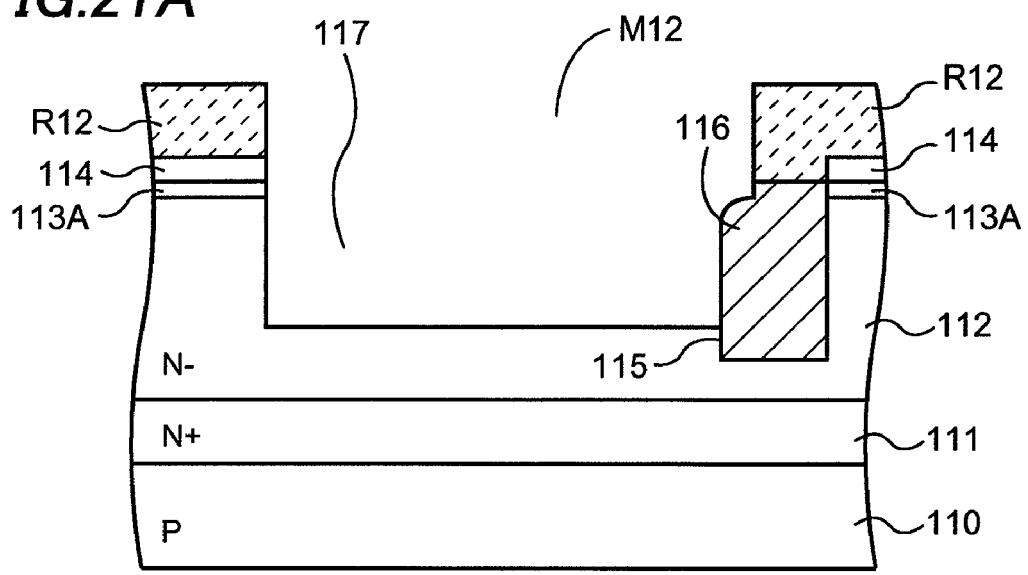
Figure 21B:
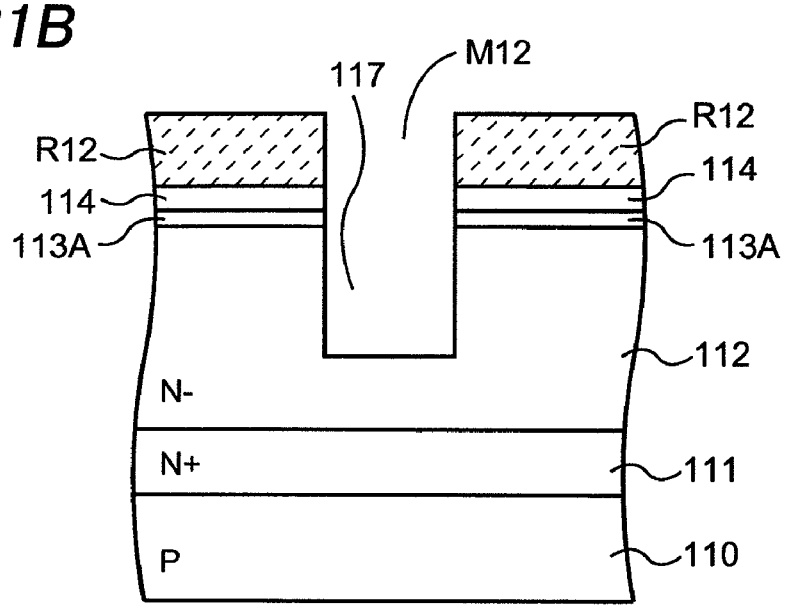

Then, as shown in FIG. 21, the N− type semiconductor layer 112 is etched using the resist layer R12 as a mask to form the trenches 117 corresponding to the opening M12. The depth of the trench 117 is preferably smaller than the depth of the concave portion 115.

Preferably, the depth of the trench 117 is about 1 μm, the long side is about 50 μm, and the short side is about 0.5 μm. Furthermore, preferably, the thickness of the trench oxide film 116 in the vertical direction (i.e. the depth of the concave portion 115) is about 1.2 μm, and the thickness of the trench oxide film 116 along the long side of the trench 117 is about 2 μm. The etching for forming the trenches 117 is preferably plasma etching using $SF_6$ or $Cl_2$ gas.

Figure 22A:
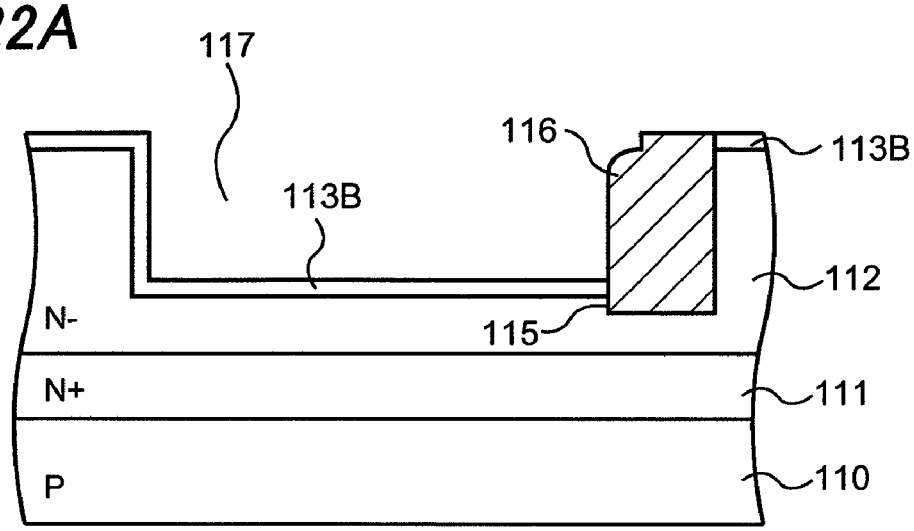
Figure 22B:
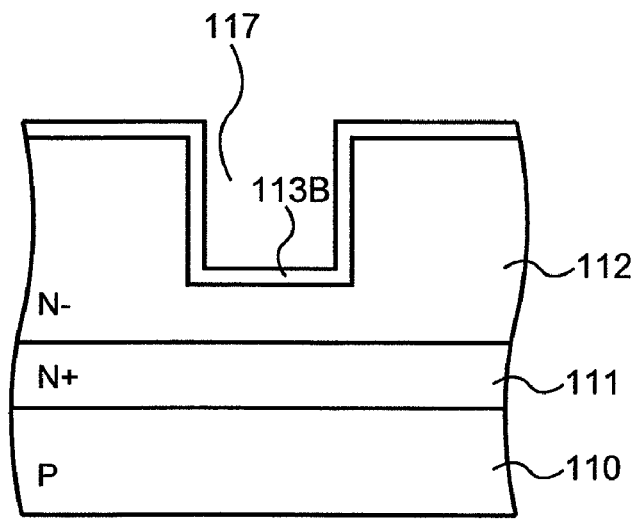

Then, after the resist layer R12, the silicon nitride film 114 and the silicon oxide film 113A are removed, as shown in FIG. 22, a thermal oxidation treatment is performed to form a gate oxide film 113B on the front surface of the N− type semiconductor layer 112 including in the trenches 117. The thickness of the gate oxide film 113B is smaller than the thickness of the trench oxide film 116. The thickness of the gate oxide film 113B is preferably about 20 nm.

Figure 23A:
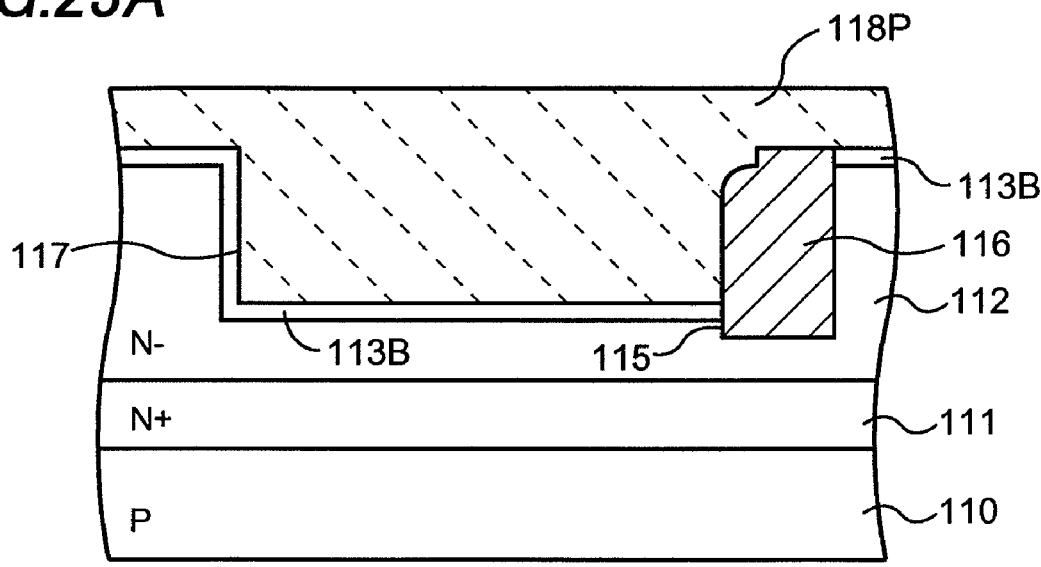
Figure 23B:
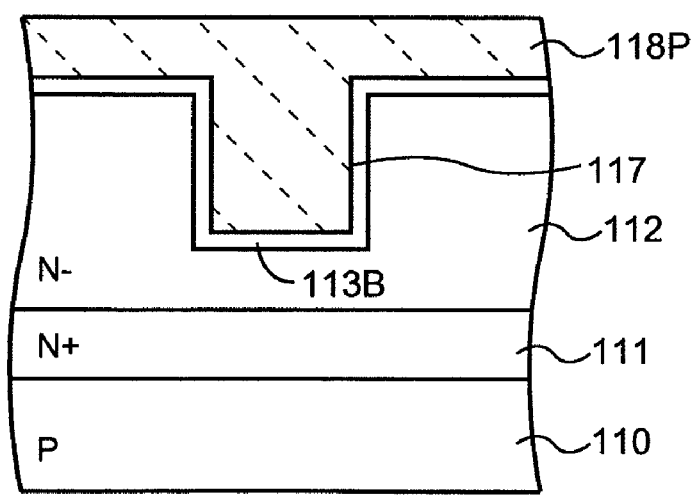

Then, as shown in FIG. 23, a polysilicon layer 118P is formed covering the gate oxide film 113B and the trench oxide film 116, and impurities are doped in the polysilicon layer 118P. The impurities are preferably of an N type impurity.

Figure 24A:
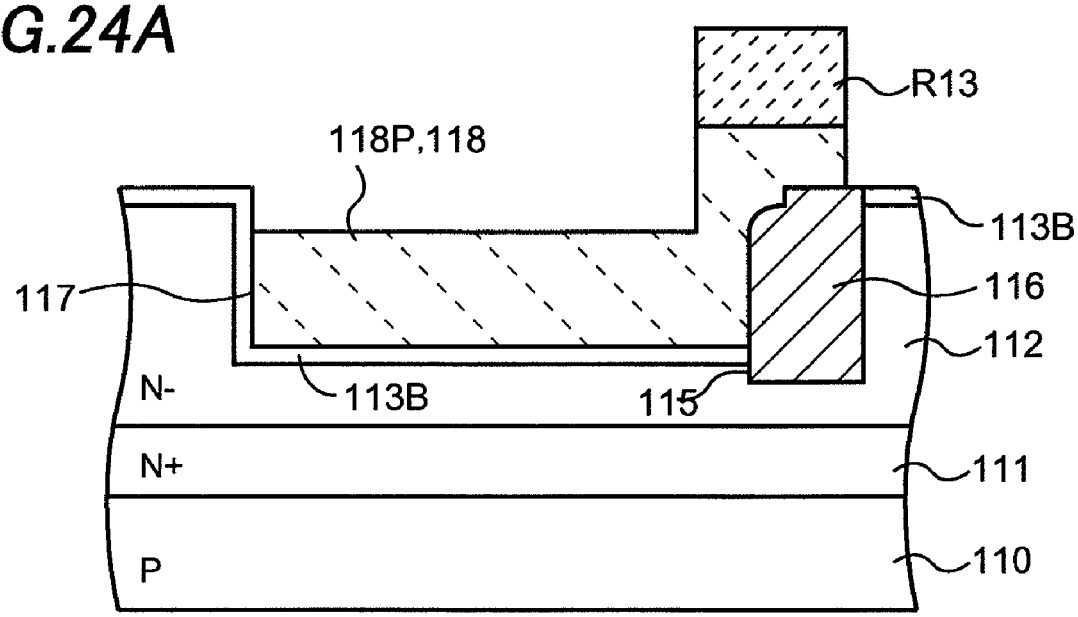
Figure 24B:
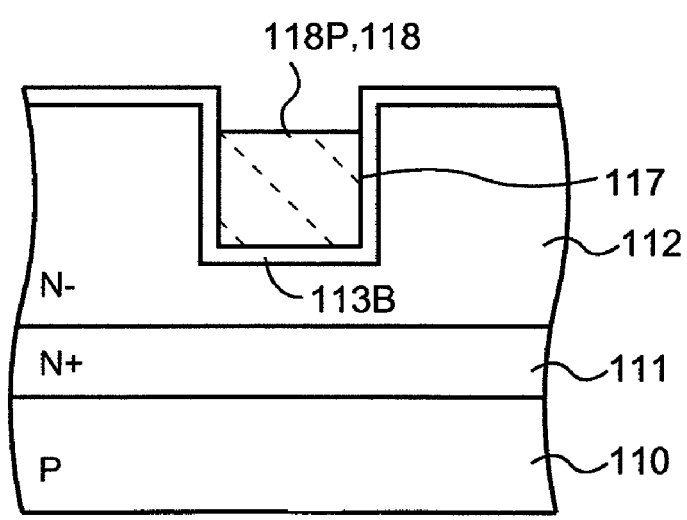

Then, as shown in FIG. 24, a resist layer R13 is formed on the polysilicon layer 118P in a region partially overlapping the trench oxide film 116. Then, the polysilicon layer 118P is etched using the resist layer R13 as a mask to form gate electrodes 118 extending from the trenches 117 onto the trench oxide film 116. The gate electrodes 118 are connected to each other on the trench oxide film 116 on the outside of the trenches 117. This etching is preferably plasma etching using $Cl_2$ gas. The resist layer R13 is then removed.

Figure 25A:
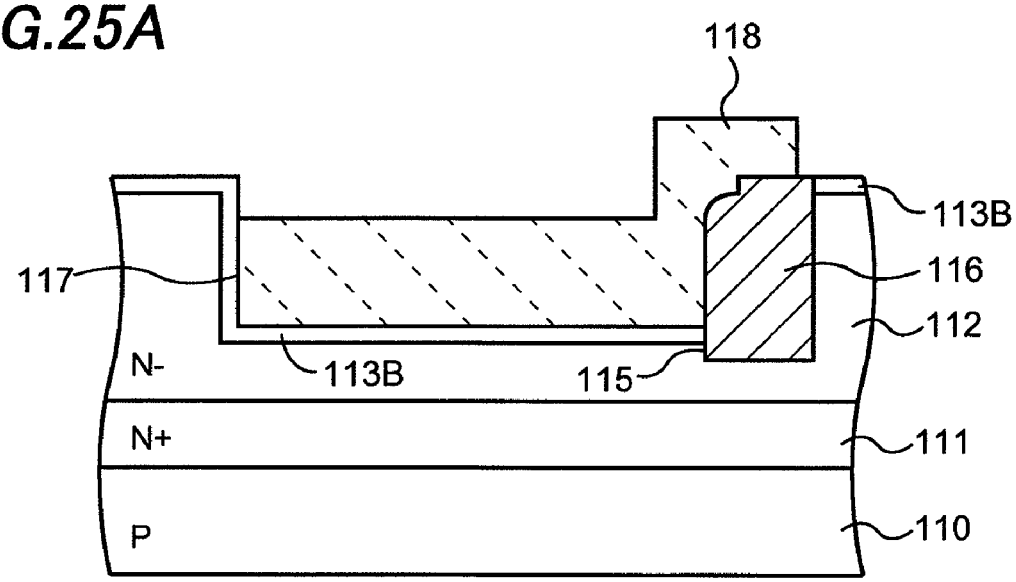
Figure 25B:
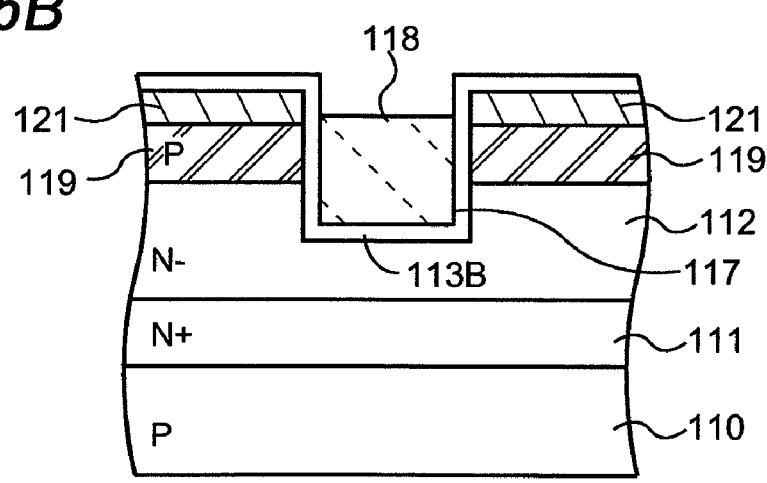
Figure 26A:
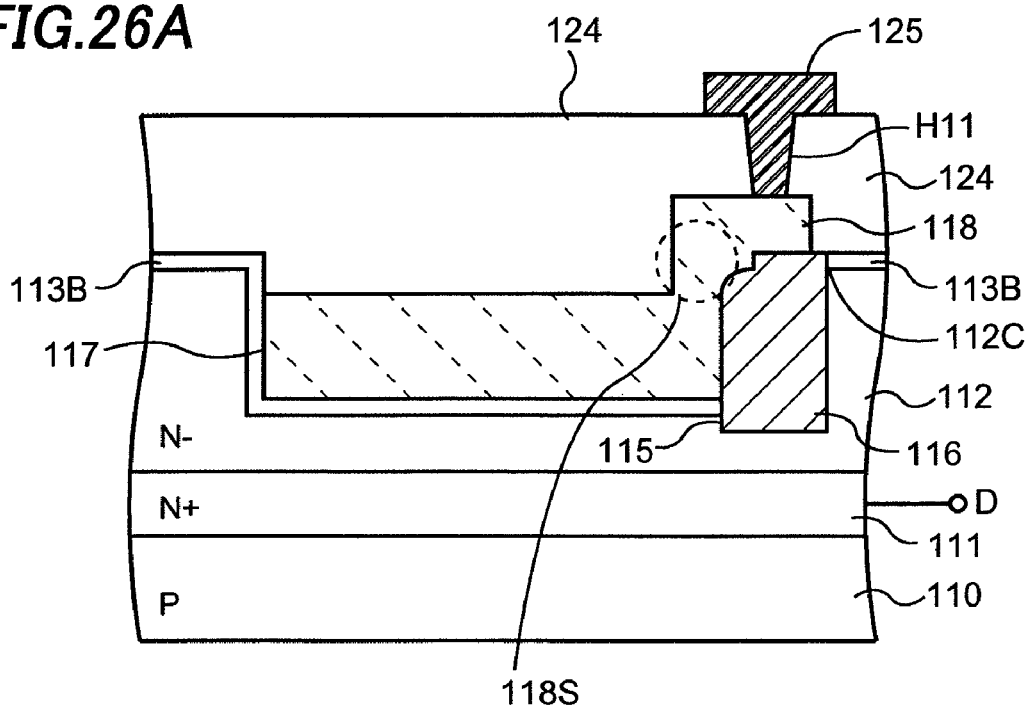
Figure 26B:
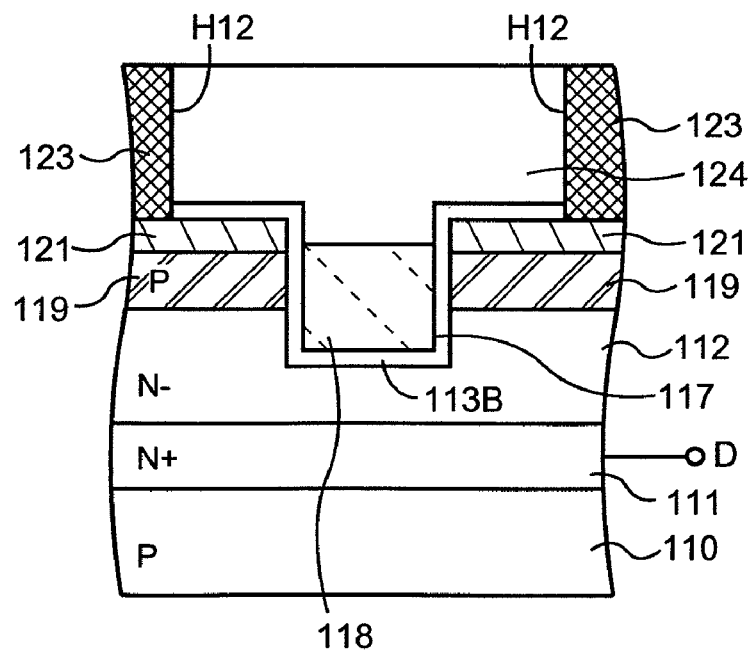

Then, as shown in FIG. 25, P type impurities are ion-implanted in the N− type semiconductor layer 112 around each of the trenches 117 in the vertical direction to form the P type body layer 119. Furthermore, N type impurities are ion-implanted in the front surface of the body layer 119 along the long sides of the trenches 117 to form the N type source layer 121. It is preferable to perform a heat treatment for the activation and the modulation of the impurity distributions of the body layer 119 and the source layer 121.

Then, as shown in FIG. 26, an interlayer insulation film 124 is formed covering the gate oxide film 113B and the gate electrodes 118. The wiring layers 125 are formed on the interlayer insulation film 124, being connected to the gate electrodes 118 through the contact holes H11 provided in the interlayer insulation film 124. Furthermore, the source electrodes 123 are formed on the interlayer insulation film 124, being connected to the source layer 121 through the contact holes H12 provided in the gate oxide film 113B and the interlayer insulation film 124.

In the transistor thus completed, when a potential of the threshold or more is applied from the wiring layers 125 to the gate electrodes 118, the surface of the body layer 119 on the sidewalls of the trenches 117 is inverted into the N type to form channels. Therefore, current flows between the source electrodes 123 and the N− type semiconductor layer 112 and the N+ type semiconductor layer 111 as a drain D.

Since the formation of the trench oxide film 116 provides a long distance between the gate electrode 118 at the leading portion 118S and the corner portion 112C of the N− type semiconductor layer 112, the gate leakage current is prevented and the gate capacitance (of the gate electrode 118 as an upper electrode, the gate oxide film 113B and the trench oxide film 116 as a capacitor insulation film, and the N− type semiconductor layer 112 as a lower electrode) is reduced.

Figure 27:
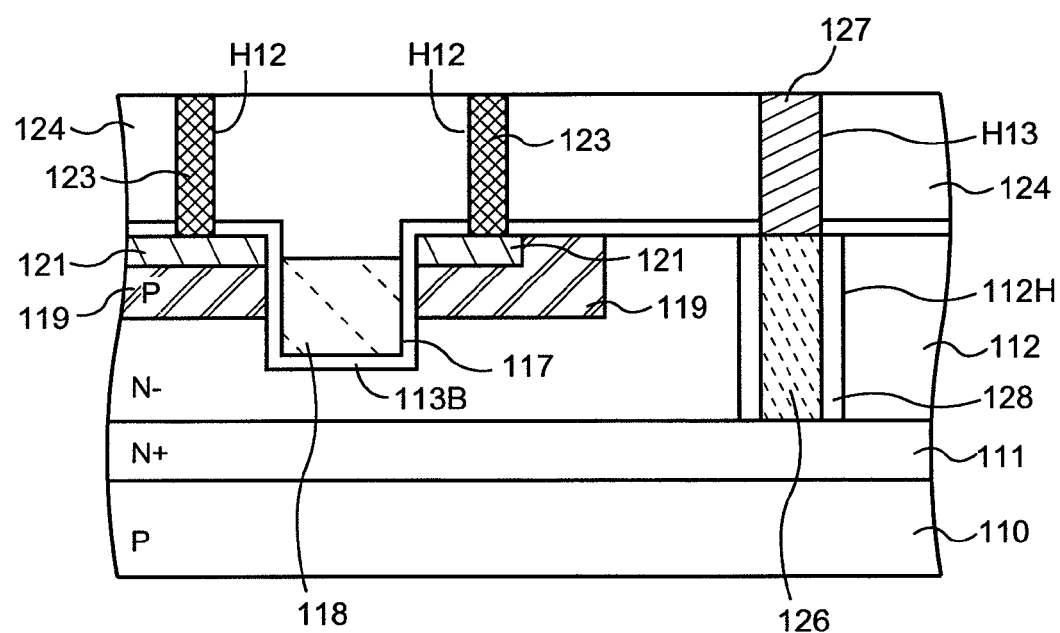

As a modification of the embodiment, a drain leading portion 126 and a drain electrode 127 may be formed as shown in FIG. 27. In this case, before the interlayer insulation film 124 is formed, an opening 112H is formed in the N− type semiconductor layer 112, an insulation film 128 is formed in the opening 112H, and the drain leading portion 126 is embedded therein. Then, the interlayer insulation film 124 is formed, a penetration hole H13 is formed penetrating the interlayer insulation film 124, and the drain electrode 127 is formed in the penetration hole H13, being connected to the drain leading portion 126.

Figure 28:
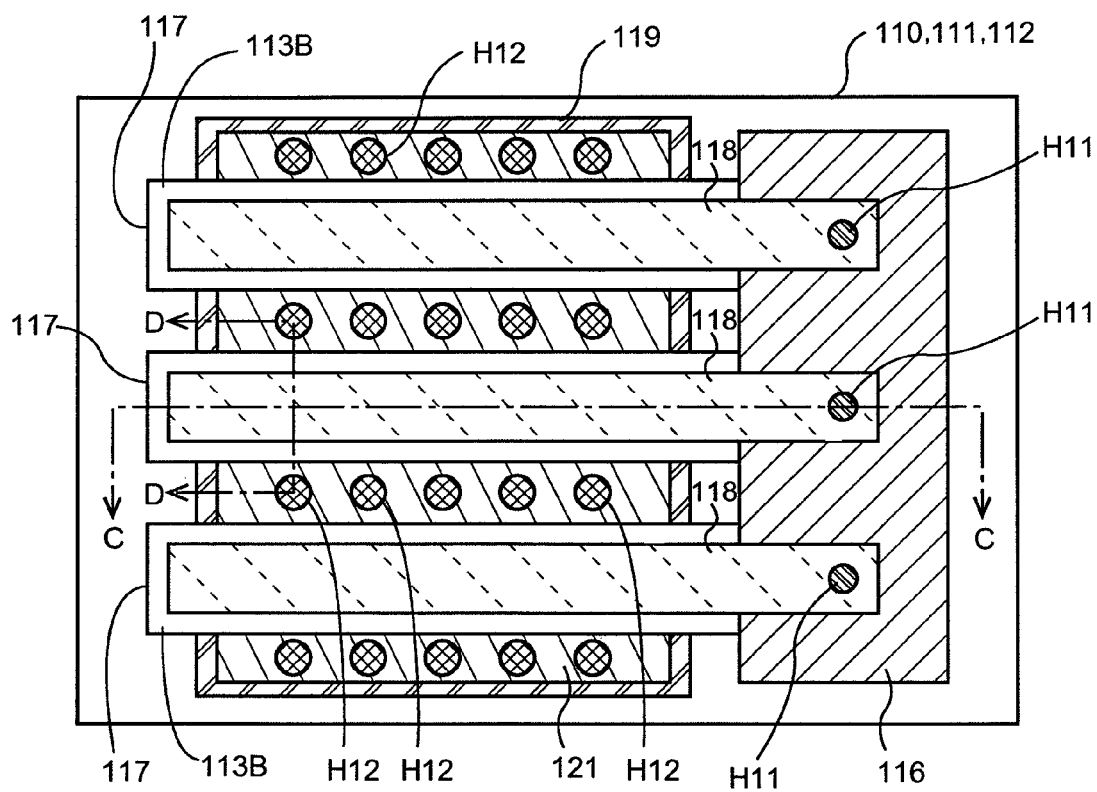

Furthermore, as other modification of the embodiment, the gate electrodes 118 may be formed separately and isolatedly for the trenches 117 respectively as shown in the plan view of FIG. 28 instead of being connected to each other on the trench oxide film 116 as shown in FIG. 14. The other structure is the same as that of FIG. 14. With this structure, when the plasma etching is performed to etch the polysilicon layer 118P, since the area of the gate electrodes 118 made of the polysilicon layer 118P is reduced, plasma damage to the gate electrodes 118 is minimized. Therefore, the reliability of the transistor is enhanced.

Figure 29:
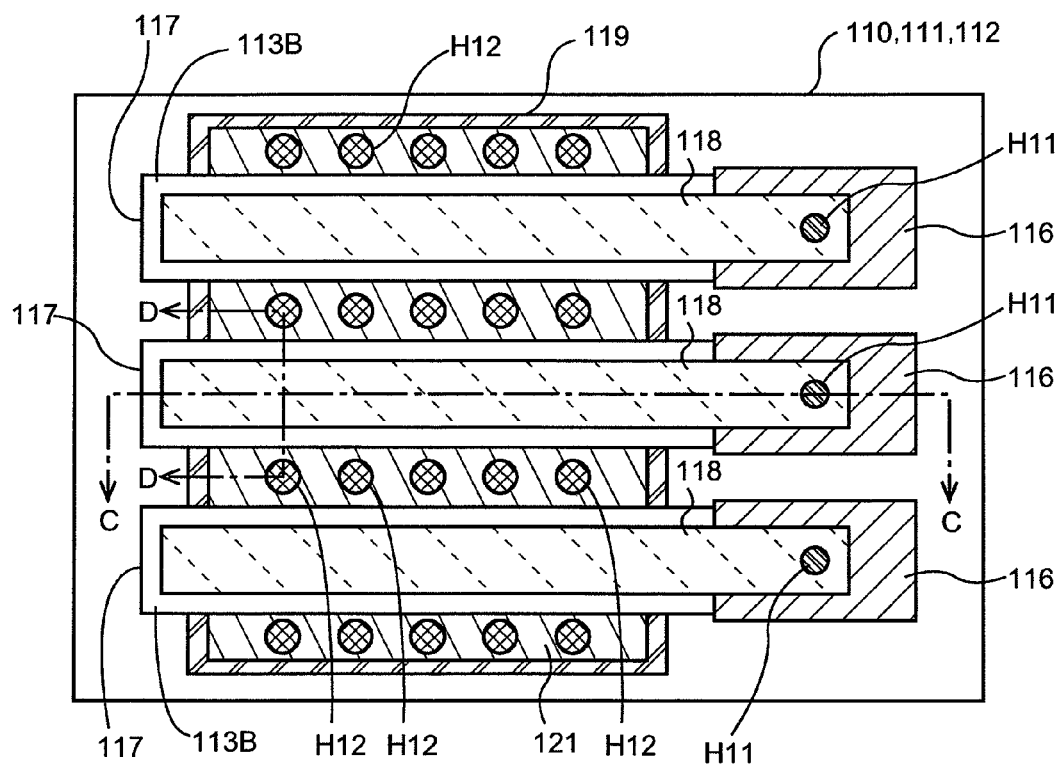

Furthermore, in order to enhance the reliability of the transistor, in addition to the structure of FIG. 28, the trench oxide film 116 may be formed separately and isolatedly for each of the trenches 117 (i.e. for each of the separated gate electrodes 118) as shown in the plan view of FIG. 29. This minimizes the crystal defect of the N− type semiconductor layer 112 due to the thermal expansion of the trench oxide film 116 in the heat treatment.

Third Embodiment

Figure 30:
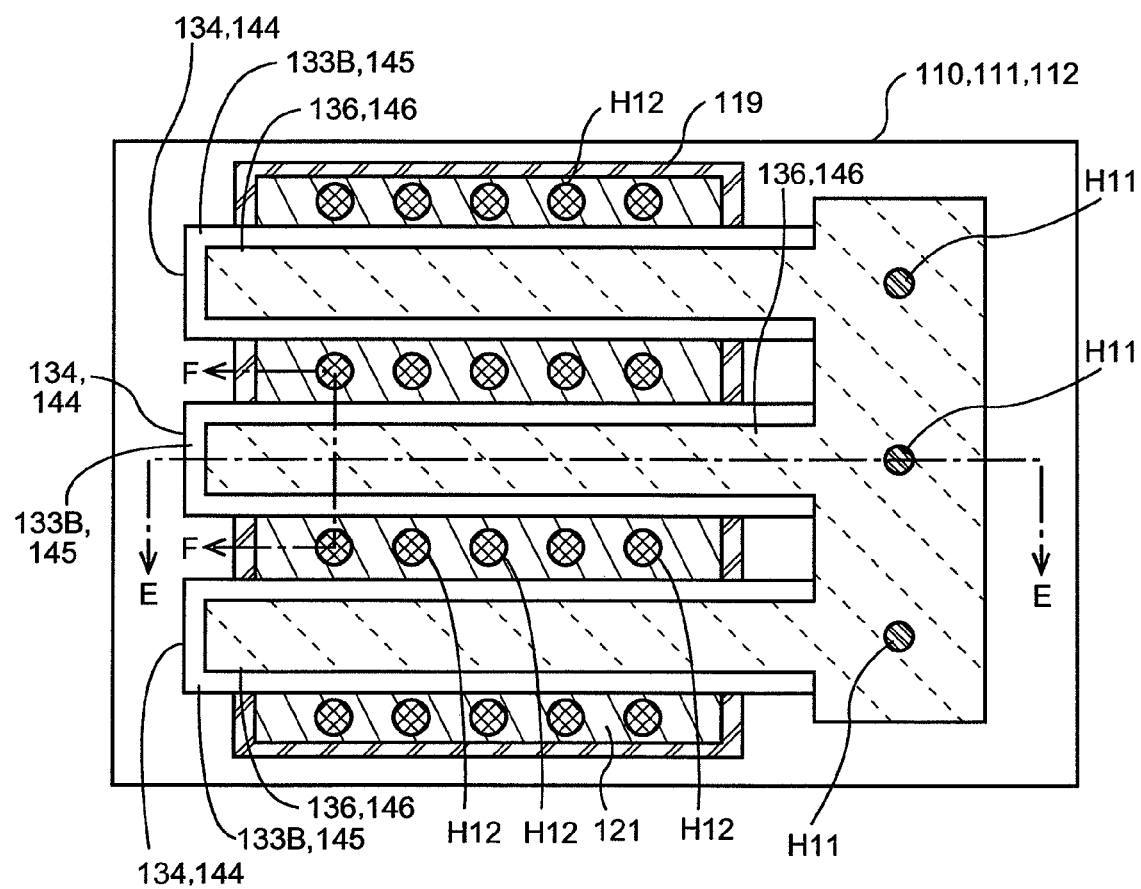
FIG. 30 is a plan view for explaining a trench gate type transistor and a method of manufacturing the same of third and fourth embodiments of the invention.
Figure 31A:
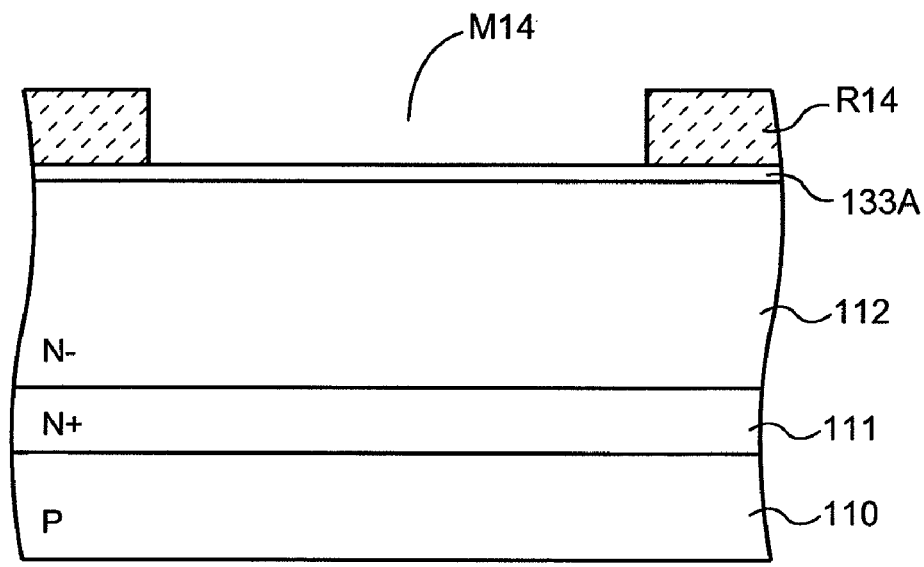
FIGS. 31 to 40 are cross-sectional views for explaining the trench gate type transistor and the method of manufacturing the same of the third embodiment of the invention.
Figure 31B:
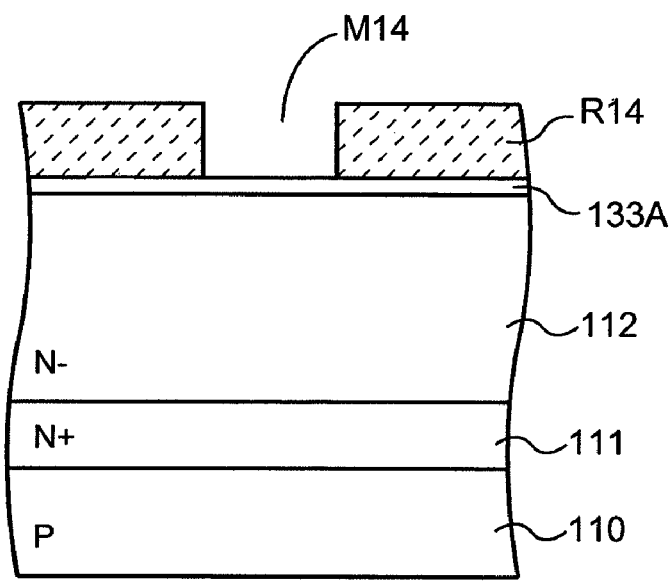

A third embodiment of the invention will be described referring to figures. FIG. 30 is a plan view for explaining a transistor and a method of manufacturing the same of the third embodiment of the invention. FIGS. 31(A) to 40(A) are cross-sectional views of FIG. 30 along line E-E, and FIGS. 31(B) to 40(B) are cross-sectional views of FIG. 30 along line F-F. In FIGS. 30 to 40, the same numerals are given to the same elements as those in FIGS. 14 to 29. This transistor has a structure using a LOCOS oxide film 133L instead of the trench oxide film 116, as shown in FIG. 40. The other structure is basically the same as that of the second embodiment.

Hereafter, the transistor and the method of manufacturing the same of the embodiment will be described referring to figures.

As shown in FIG. 31, in the similar manner to the second embodiment, an N+ type semiconductor layer 111 and an N− type semiconductor layer 112 are formed on a semiconductor substrate 110. A silicon oxide film 133A is then formed on the N− type semiconductor layer 112. Then, a resist layer R14 having an opening M14 is formed on the silicon oxide film 133A.

Figure 32A:
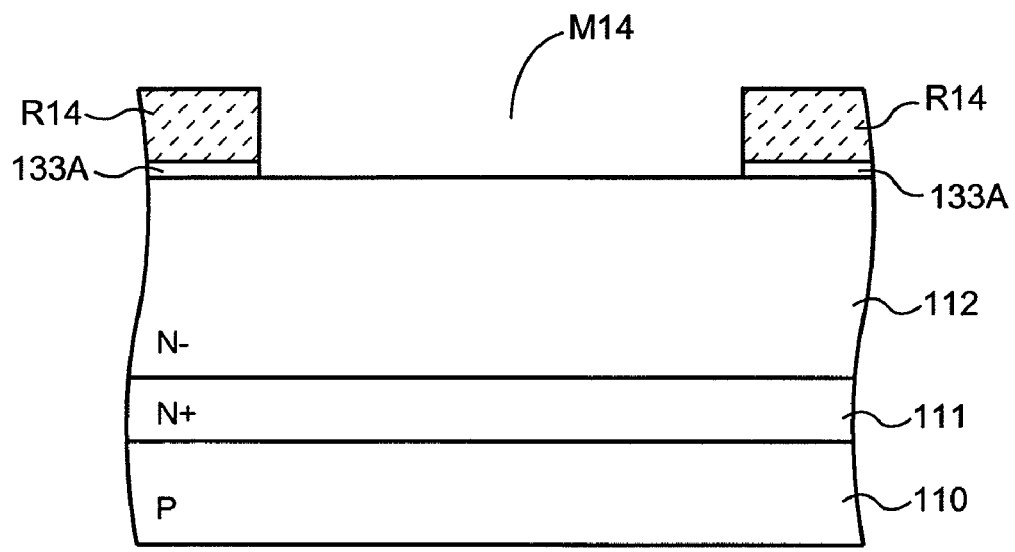
Figure 32B:
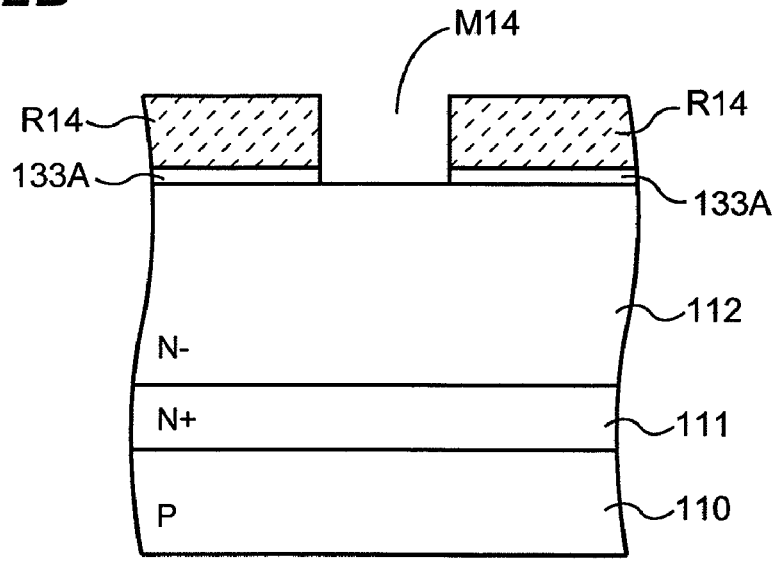

Then, as shown in FIG. 32, the silicon oxide film 133A in the opening M14 is etched and removed using the resist layer R14 as a mask. By this process, the N− type semiconductor layer 112 is exposed in the opening M14.

Figure 33A:
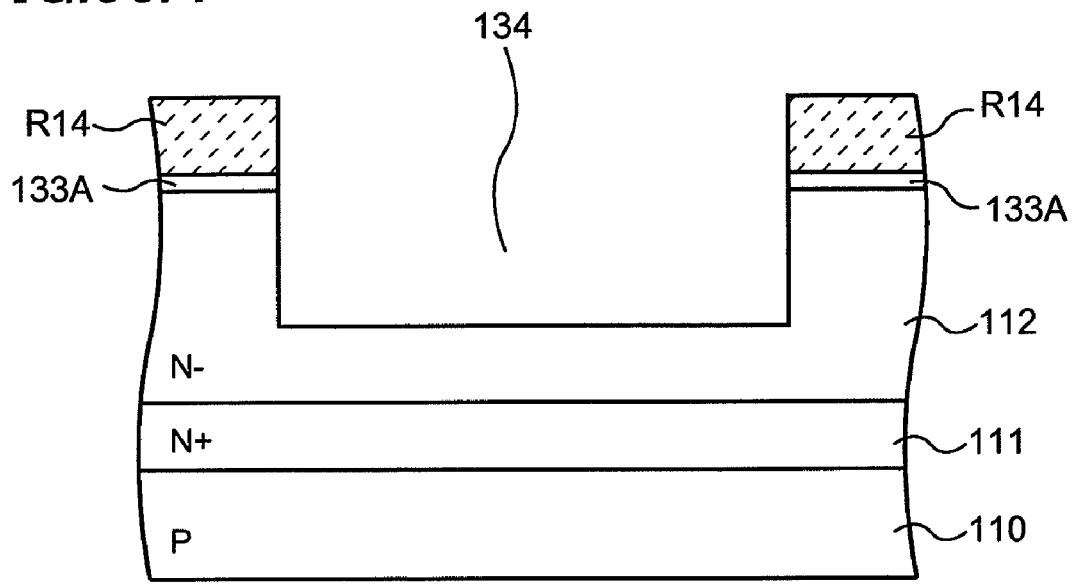
Figure 33B:
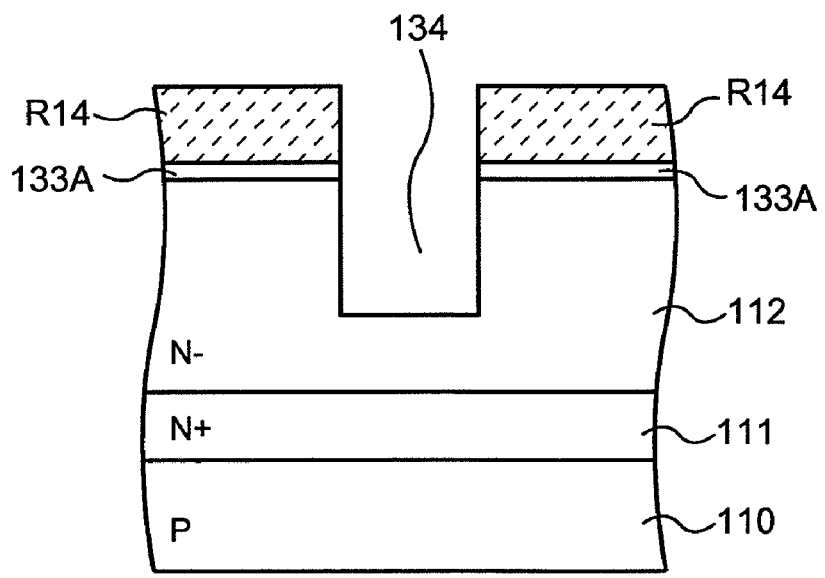

Then, as shown in FIG. 33, the N− type semiconductor layer 112 is etched using the resist layer R14 as a mask to form trenches 134.

Figure 34A:
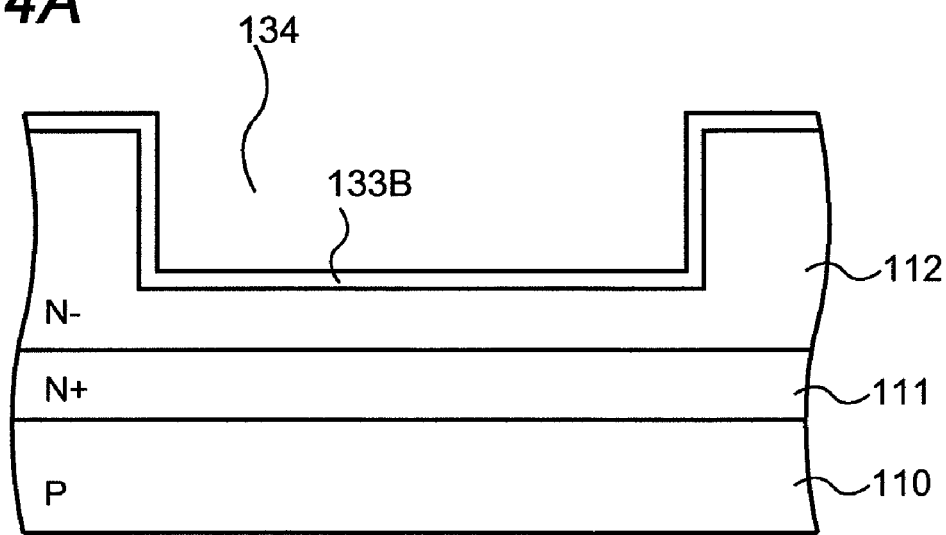
Figure 34B:
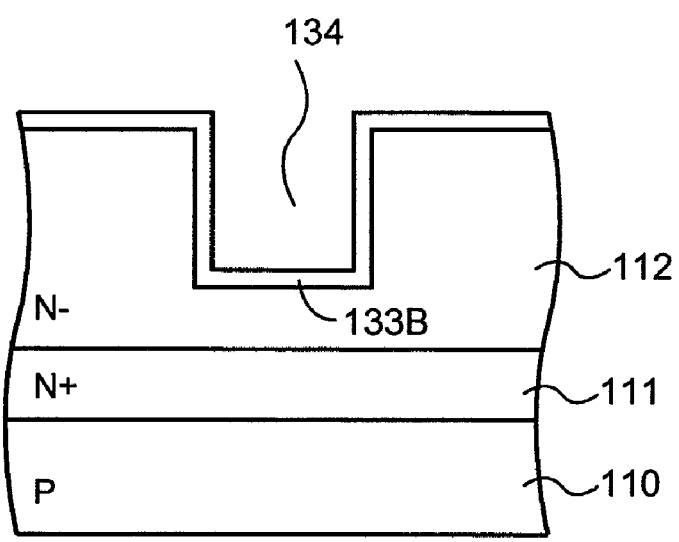

Then, after the resist layer R14 and the silicon oxide film 133A are removed, a gate oxide film 133B is formed in the trenches 134 by a thermal oxidation treatment as shown in FIG. 34. Preferably, the thickness of the gate oxide film 133B is about 20 nm.

Figure 35A:
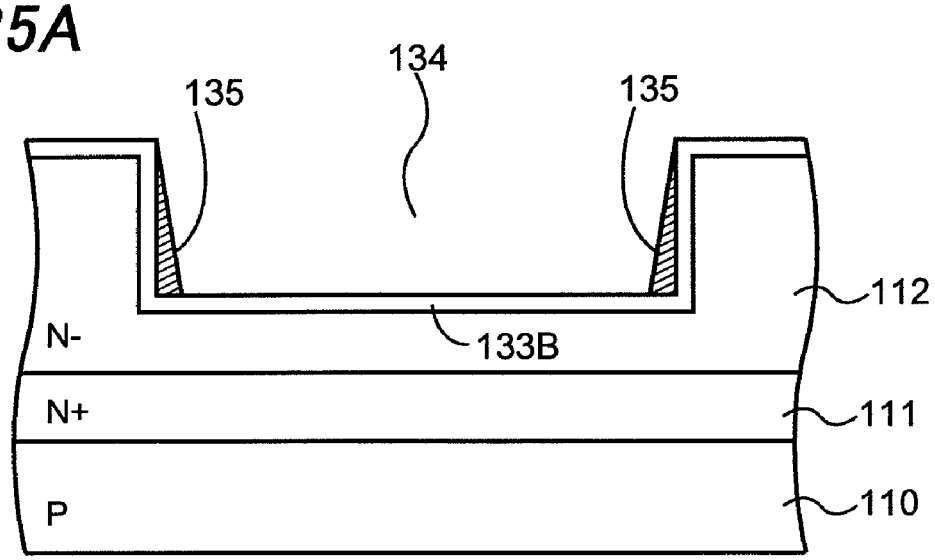
Figure 35B:
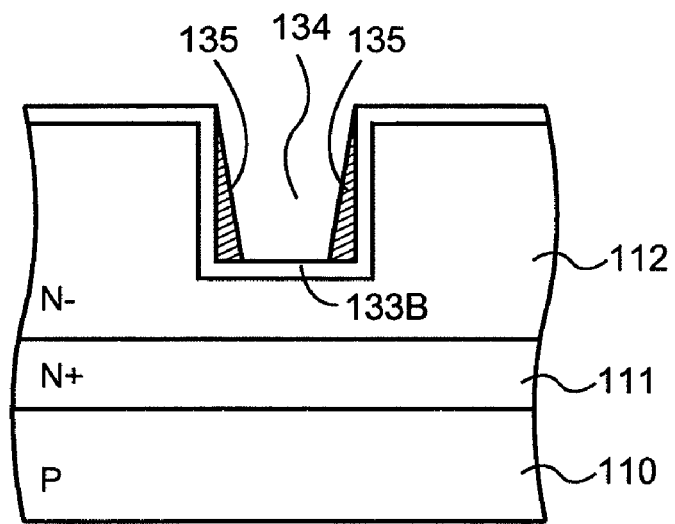

Then, as shown in FIG. 35, a silicon nitride film 135 is formed covering the silicon oxide film 133B by a CVD method, and the silicon nitride film 135 is etched back. By this process, the silicon nitride film 135 remains on the gate oxide film 133B on the sidewalls of the trenches 134.

Figure 36A:
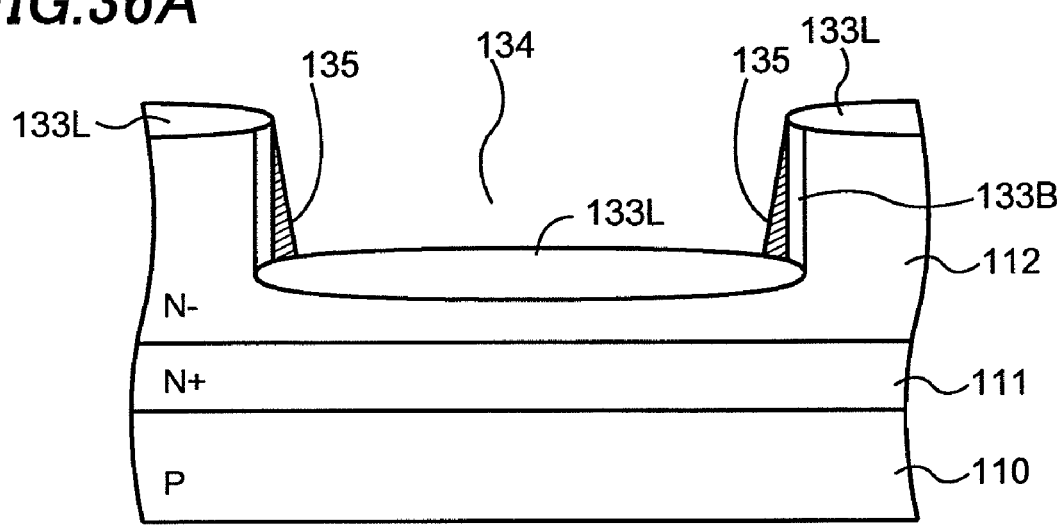
Figure 36B:
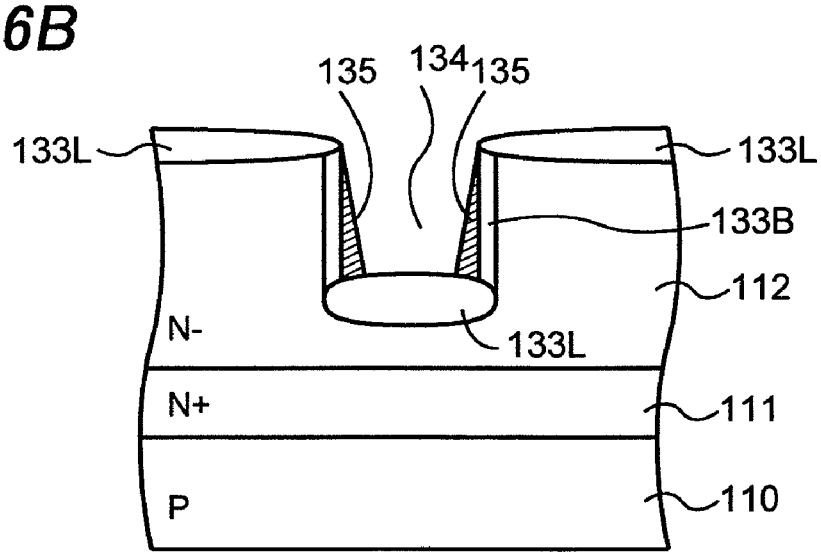

Then, as shown in FIG. 36, a LOCOS oxide film 133L covering the bottoms of the trenches 134 and the outside ends of the trenches 134 is formed by a thermal oxidation treatment using the silicon nitride film 135 as a mask. The thickness of the LOCOS oxide film 133L is larger than the thickness of the gate oxide film 133B formed at first.

Figure 37A:
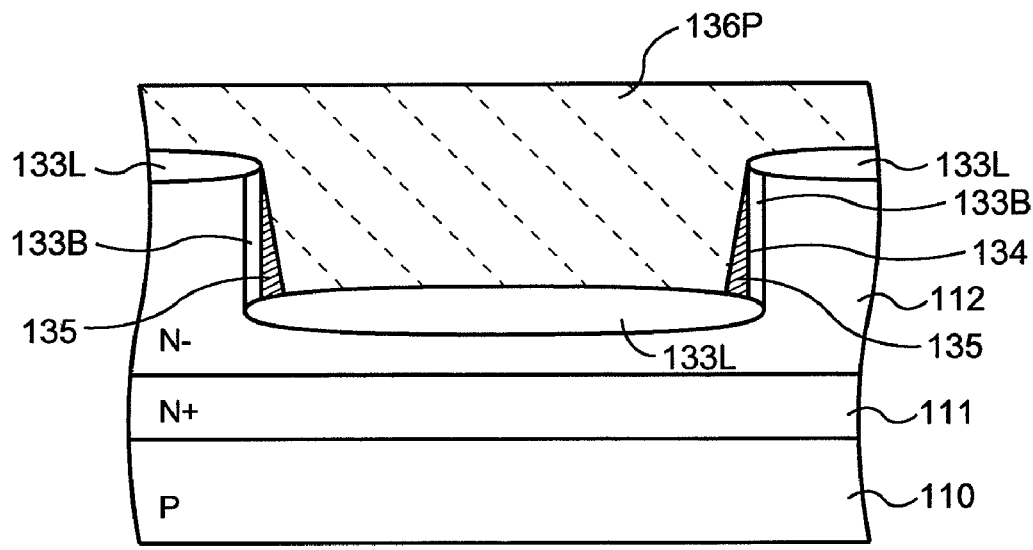
Figure 37B:
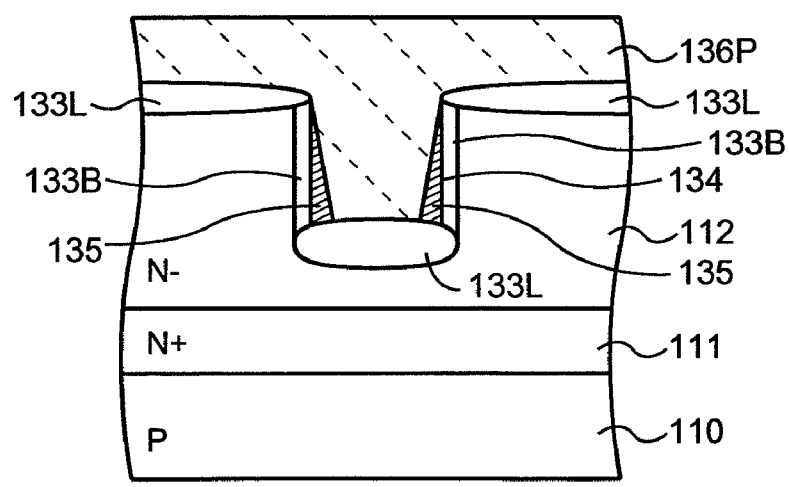

Then, as shown in FIG. 37, a polysilicon layer 136P is formed covering the gate oxide film 133B and the LOCOS oxide film 133L, and impurities are doped therein. The impurities are preferably of an N type impurity.

Figure 38A:
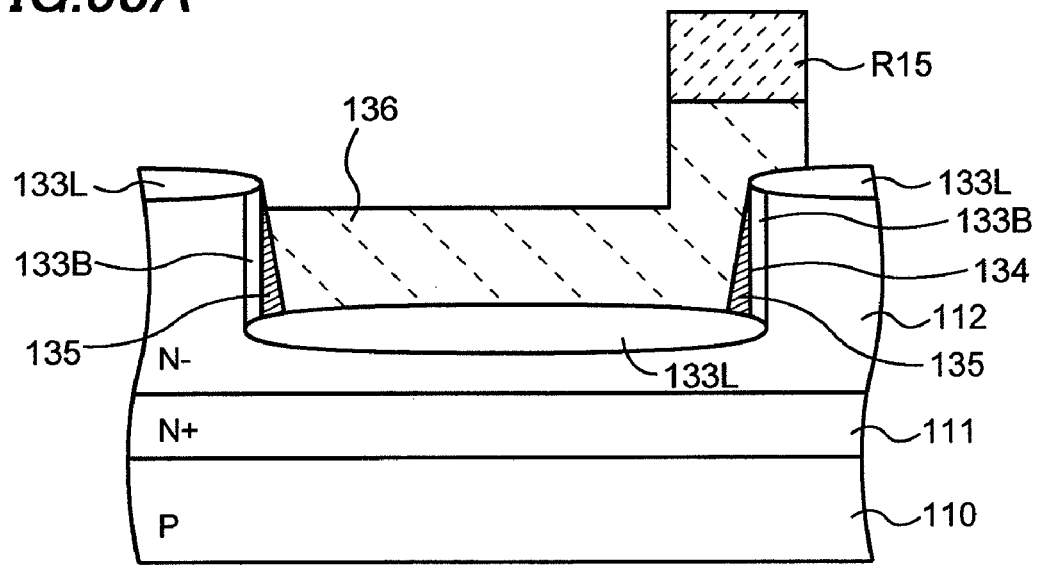
Figure 38B:
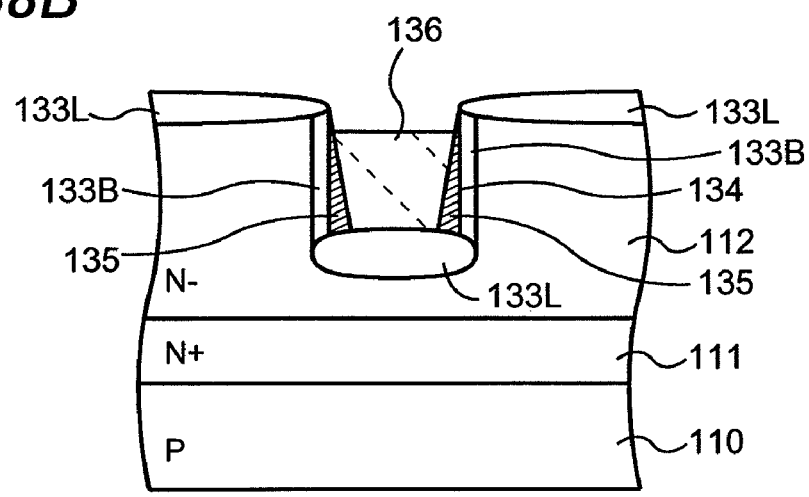

Then, as shown in FIG. 38, a resist layer R15 is formed on the polysilicon layer 136P in a region overlapping a part of the LOCOS oxide film 133L. The polysilicon layer 136P is then etched using the resist layer R15 as a mask to form gate electrodes 136 extending from the trenches 134 onto the LOCOS oxide film 133L on the outside. The gate electrodes 136 are connected to each other on the LOCOS oxide film 133L on the outside of the trenches 134. The resist layer R15 is then removed.

Figure 39A:
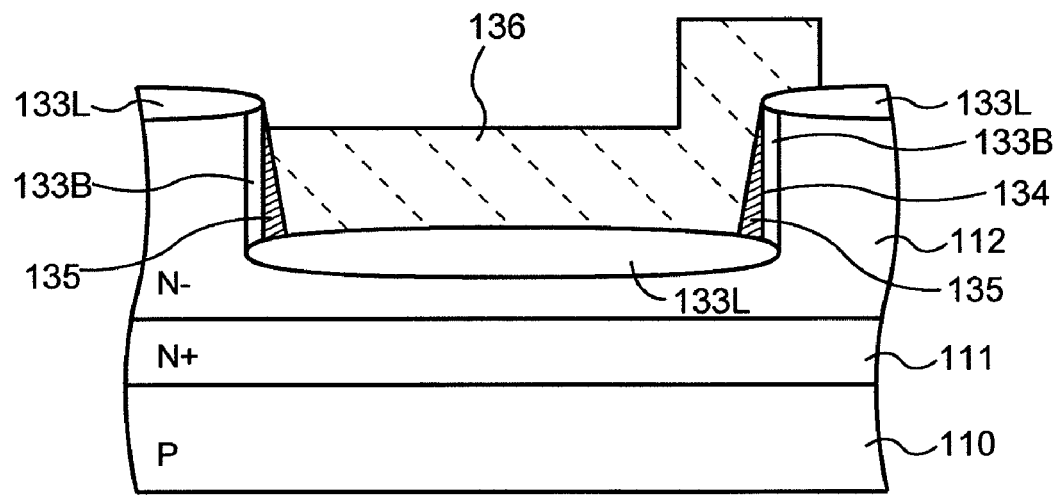
Figure 39B:
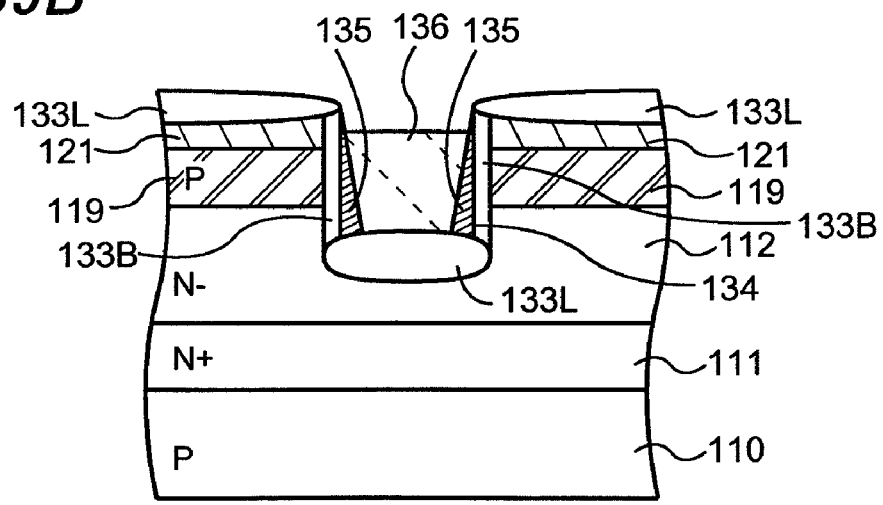
Figure 40A:
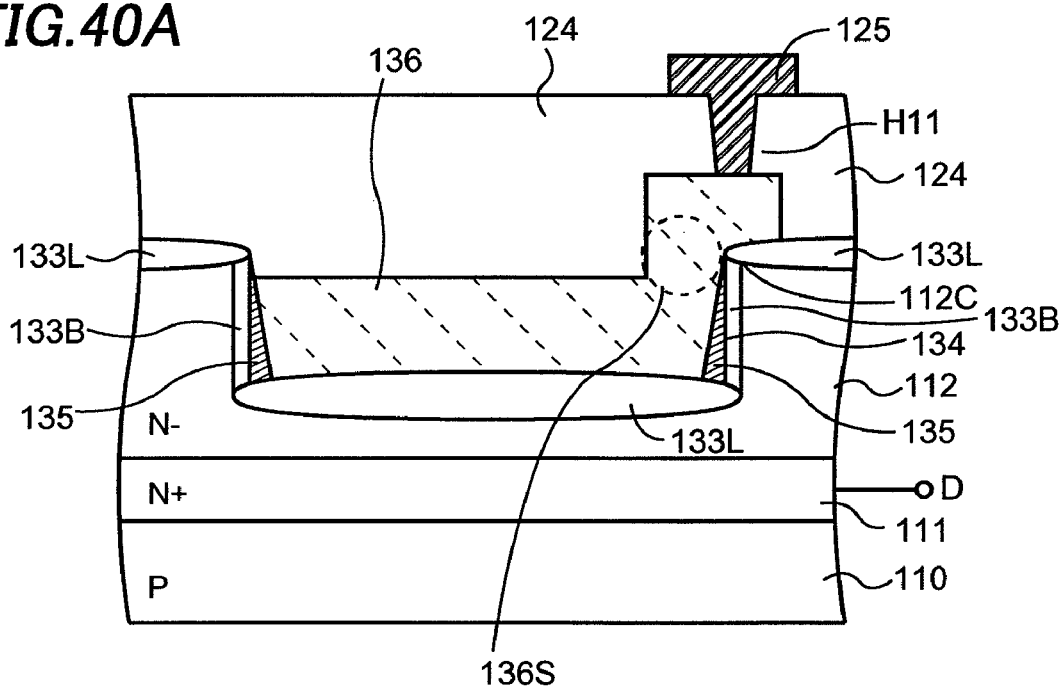
Figure 40B:
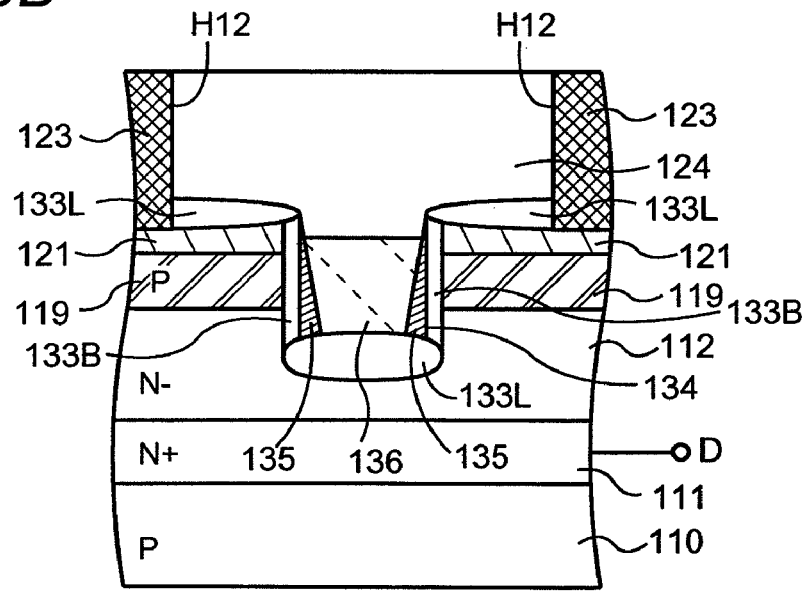
Figure 41A:
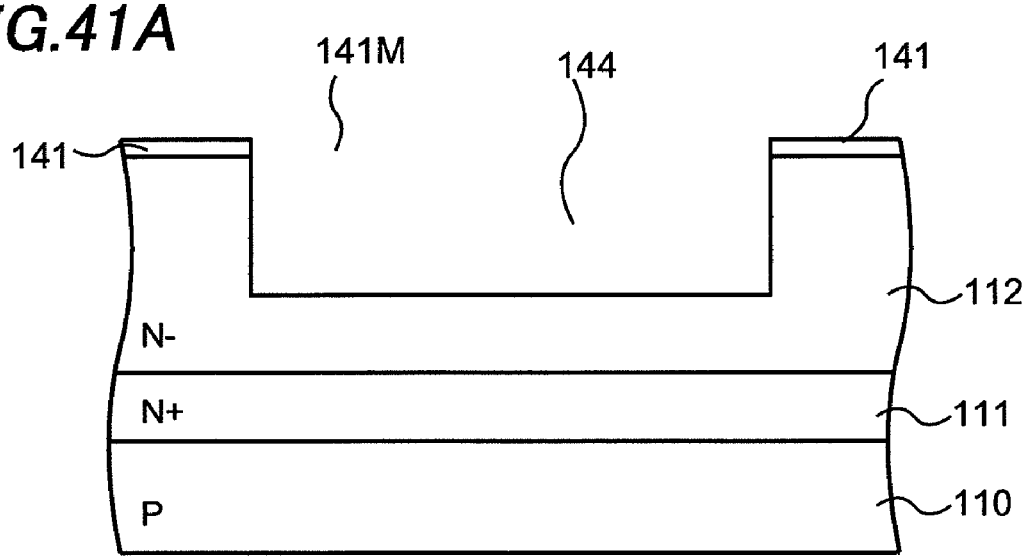
FIGS. 41 to 47 are cross-sectional views for explaining the trench gate type transistor and the method of manufacturing the same of the fourth embodiment of the invention.
Figure 41B:
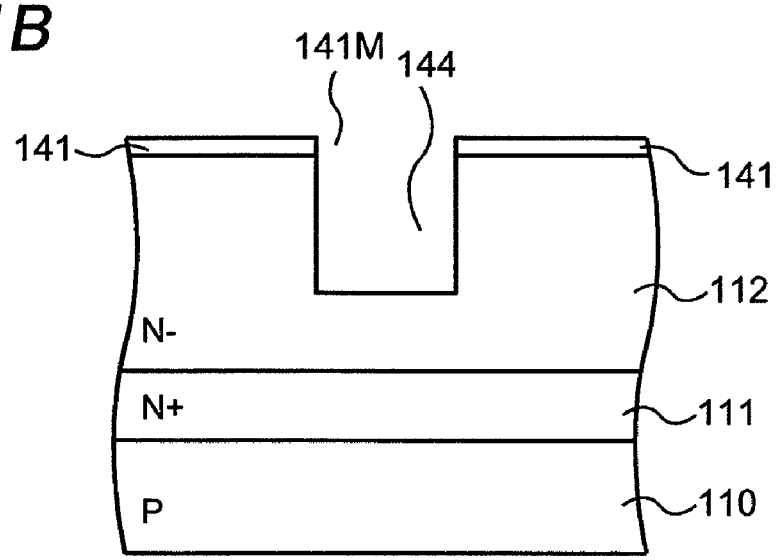

Then, as shown in FIG. 39, a body layer 119 and a source layer 121 are formed in the front surface of the N− type semiconductor layer 112 in the similar manner to the second embodiment.

Then, as shown in FIG. 40, an interlayer insulation film 124 is formed covering the LOCOS oxide film 133L and the gate electrodes 136. Wiring layers 125 are formed on the interlayer insulation film 124, being connected to the gate electrodes 136 through contact holes H11 provided in the interlayer insulation film 124. Furthermore, source electrodes 123 are formed on the interlayer insulation film 124, being connected to the source layer 121 through contact holes H12 provided in the interlayer insulation film 124 and the LOCOS oxide film 133L.

In the transistor thus completed, in the similar manner to the second embodiment, when a potential of the threshold or more is applied from the wiring layers 125 to the gate electrodes 136, the surface of the body layer 119 on the sidewalls of the trenches 134 is inverted into the N type to form channels. Therefore, current flows between the source electrodes 123 and the N− type semiconductor layer 112 and the N+ type semiconductor layer 111 as a drain D. By the silicon nitride film 135 remaining on the sidewalls of the trenches 134, the thickness of the gate oxide film 133B is complemented to enhance the reliability, but the silicon nitride film 135 may be removed when the lower threshold is required.

Since the formation of the LOCOS oxide film 133L provides a long distance between the gate electrode 136 at the leading portion 136S and the corner portion 112C of the N− type semiconductor layer 112, the gate leakage current is prevented and the gate capacitance (of the gate electrode 136 as an upper electrode, the gate oxide film 133B and the LOCOS oxide film 133L as a capacitor insulation film, and the N− type semiconductor layer 112 as a lower electrode) is reduced.

As a modification of the embodiment, in the similar manner to the second embodiment shown in FIG. 27, a drain leading portion 126 and a drain electrode 127 may be formed. In this case, before the interlayer insulation film 124 is formed, an opening 112H is formed in the N− type semiconductor layer 112, an insulation film 128 is formed in the opening 112H, and the drain leading portion 126 is embedded therein. Then, the interlayer insulation film 124 is formed, a penetration hole H13 is formed penetrating the interlayer insulation film 124, and the drain electrode 127 is formed in the penetration hole H13, being connected to the drain leading portion 126.

Furthermore, as other modification of the embodiment, the gate electrodes 136 may be formed separately and isolatedly for the trenches 134 respectively in the similar manner to the second embodiment shown in FIG. 28. In this case, too, the same effect as that of the second embodiment is obtained.

Fourth Embodiment

A fourth embodiment of the invention will be described referring to figures. The schematic plan structure of this transistor is the same as shown in FIG. 30.

Hereafter, a transistor and a method of manufacturing the same of the embodiment will be described referring to figures.

FIGS. 41(A) to 47(A) are cross-sectional views of FIG. 30 along line E-E, and FIGS. 41(B) to 47(B) are cross-sectional views of FIG. 30 along line F-F. In FIG. 30, and FIGS. 41 to 47, the same numerals are given to the same elements as those in FIGS. 30 to 40.

As shown in FIG. 41, in the similar manner to the second embodiment, an N+ type semiconductor layer 111 and an N− type semiconductor layer 112 are formed on a semiconductor substrate 110. A silicon oxide film 141 having an opening 141M is formed as a hard mask on the N− type semiconductor layer 112. Preferably, the thickness of the silicon oxide film 141 is about 100 nm.

Then, the N− type semiconductor layer 112 is etched using the silicon oxide film 141 as a hard mask to form trenches 144 having short sides and long sides corresponding to the opening 141M. The silicon oxide film 141 is then removed.

Figure 42A:
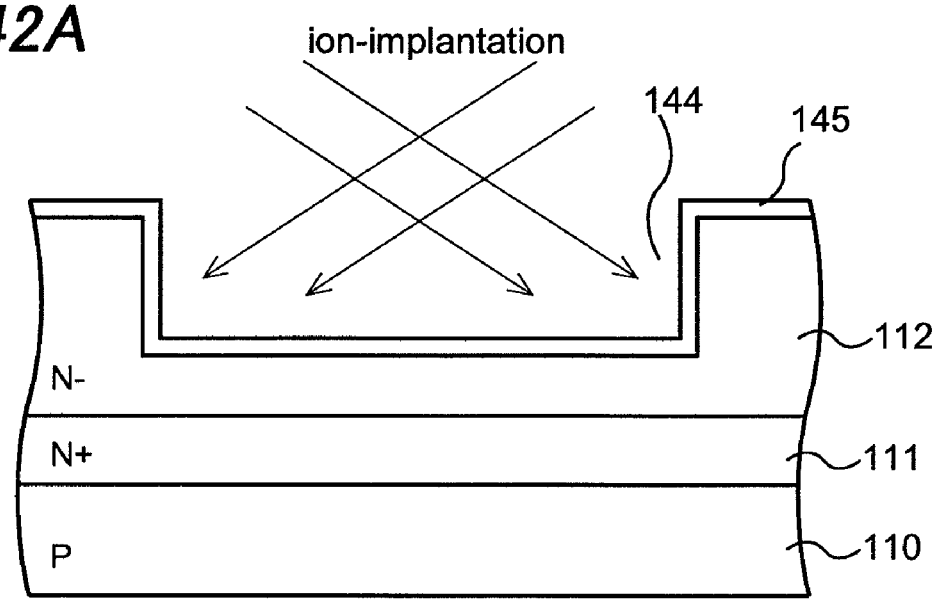
Figure 42B:
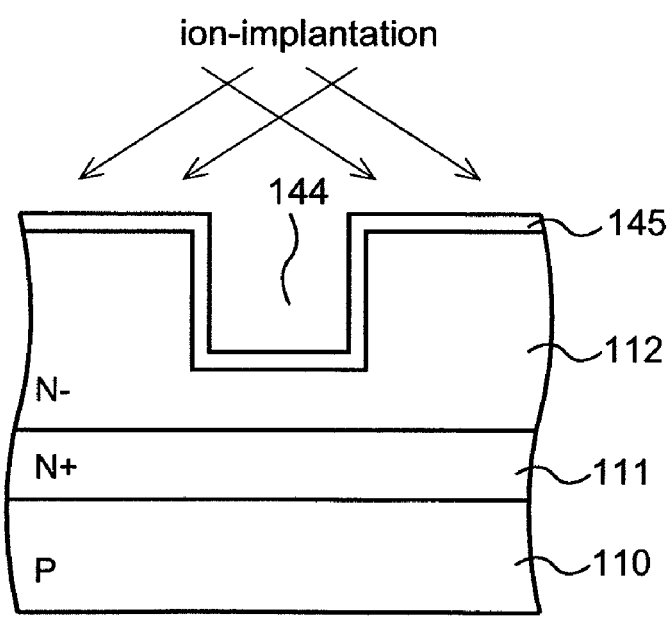

Then, as shown in FIG. 42, a thermal oxidation treatment is performed to the front surface of the N− type semiconductor layer 112 in the trenches 144 to form a gate oxide film 145. Preferably, the thickness of the gate oxide film 145 at this time is about 20 nm. Then, impurities such as argon or the like are obliquely ion-implanted in the N− type semiconductor layer 112 through the gate oxide film 145. This oblique ion-implantation is preferably performed at an incident angle of about 10 to 45 degrees relative to the horizontal surface of the semiconductor substrate 110 in the long side and short side directions of the trenches 144. It is more preferable to set the incident angle at about 30 degrees relative to the horizontal surface of the semiconductor substrate 110. Furthermore, when the impurities are of argon, the dose of the ion-implantation is $1\times10^{16}/cm^2$ and the acceleration energy is about 40 KeV, preferably.

In this ion-implantation, for example, a first oblique ion-implantation is performed in the long side direction of the trenches 144, and then a second oblique ion-implantation is performed in the reverse direction. Then, a third oblique ion-implantation is performed in the short side direction of the trenches 144, and then a fourth oblique ion-implantation is performed in the reverse direction. As other method than above, some or all of the first to fourth oblique ion-implantations may be performed simultaneously.

By the first and second oblique ion-implantations, an impurity implantation layer is formed on the N− type semiconductor layer 112 on the side and bottom surfaces of the trenches 144 and on the front surface of the N− type semiconductor layer 112 near the trenches 144. On the other hand, by the third and fourth oblique ion-implantations, an impurity implantation layer is formed on the N− type semiconductor layer 112 on the upper portions of the side surfaces of the trenches 144 and on the front surface of the N− type semiconductor layer 112 near the trenches 144. It means that by the third and fourth oblique ion-implantations, the impurities are not implanted in the lower portions of the side surfaces and the bottom surfaces of the trenches 144.

Figure 43A:
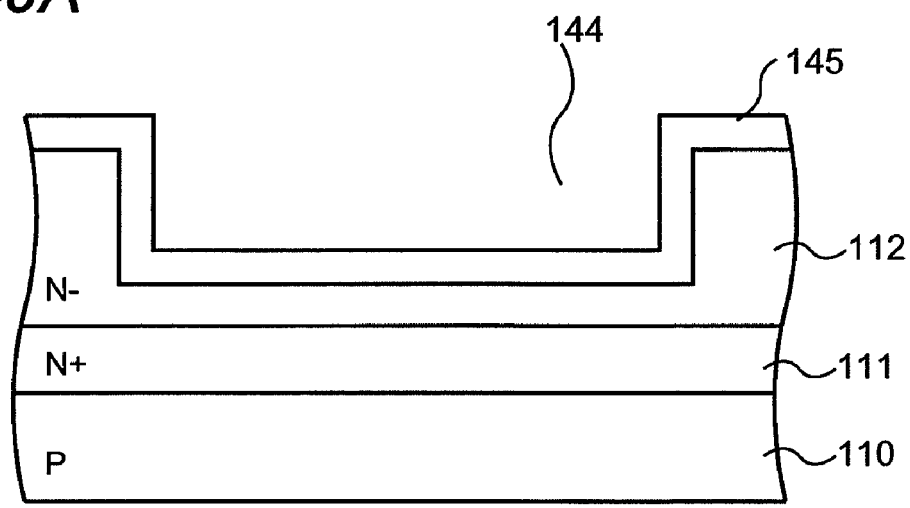

Then, a gate oxide film 145 is formed by a thermal oxidation treatment. At this time, only a region where the impurities are ion-implanted in the previous process is oxidized acceleratedly. By this process, as shown in FIG. 43(A), the gate oxide film 145 is thick in a region on the front surface of the N− type semiconductor layer 112, on the bottoms of the trenches 144 along the long sides, and on the sidewalls of the trenches 144 along the short sides since the ion is implanted enough there.

Figure 43B:
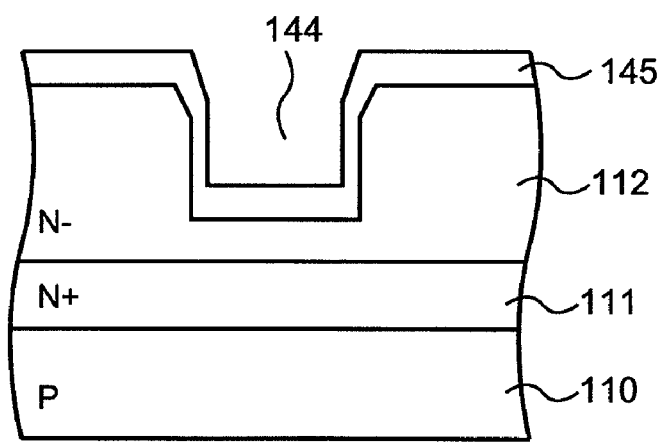

On the other hand, as shown in FIG. 43(B), although the gate oxide film 145 is thick on the upper portions of the sidewalls of the trenches 144 along the long sides (i.e. near the opening portions of the trenches 144) since the ion is implanted enough there, the film 145 is not thick on the lower portions of the sidewalls. The thickness of the thick portion of the gate oxide film 145 is larger than the thickness of the other portion by about 10 to 150%, and preferably about 30% or more.

Figure 44A:
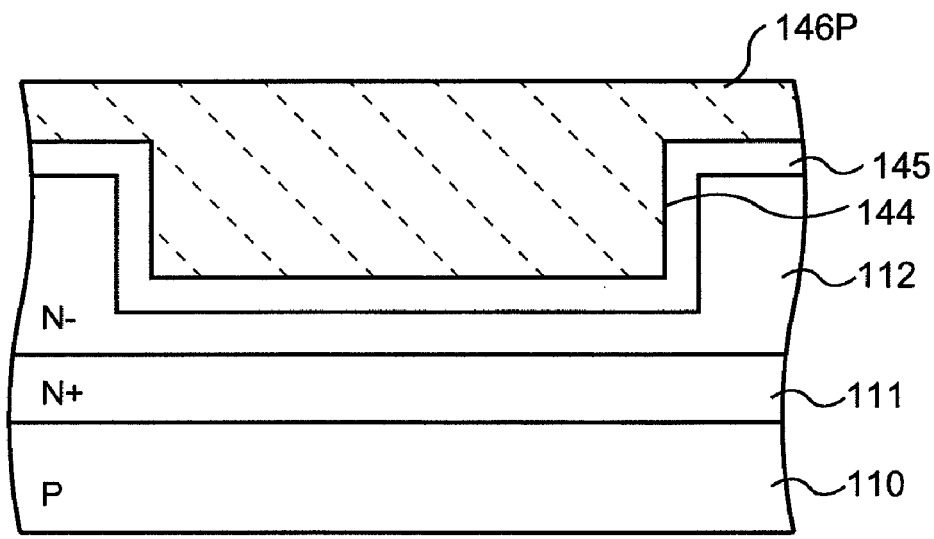
Figure 44B:
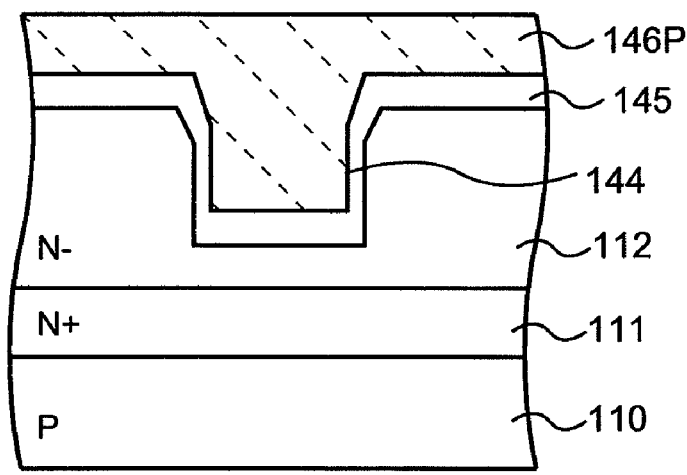

Then, as shown in FIG. 44, a polysilicon layer 146P is formed covering the gate oxide film 145, and impurities are doped therein. The impurities are preferably of an N type impurity.

Figure 45A:
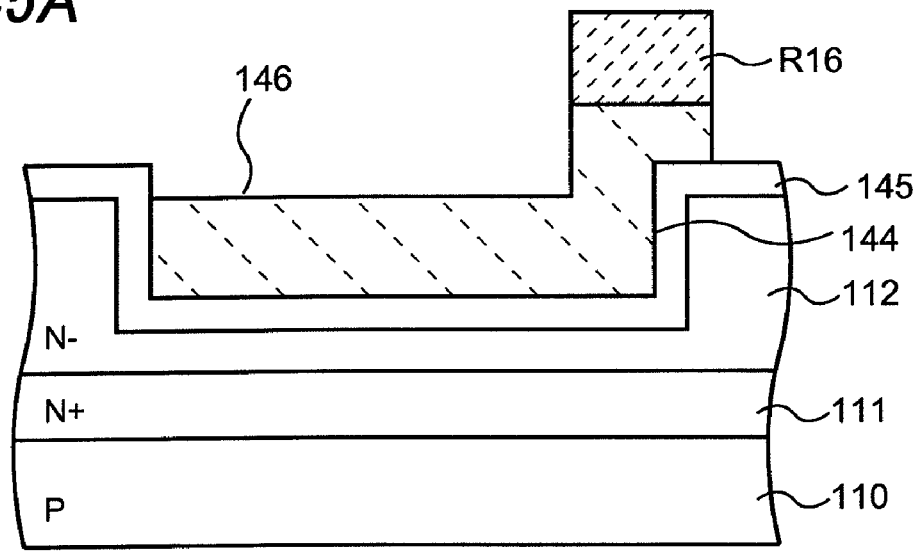
Figure 45B:
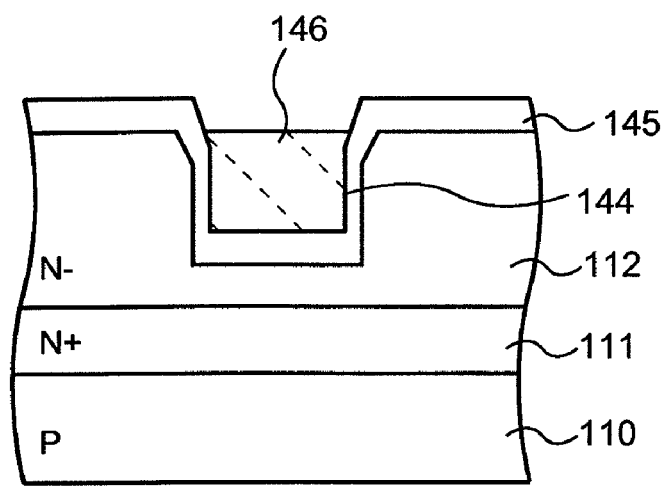

Then, as shown in FIG. 45, a resist layer R16 is formed on the polysilicon layer 146P in a region overlapping a part of the thick gate oxide film 145. Then, the polysilicon layer 146P is etched using the resist layer R16 as a mask to form gate electrodes 146 extending from the trenches 144 onto the gate oxide film 145 on the outside of the trenches 144. The gate electrodes 146 are connected to each other on the gate oxide film 145 on the outside of the trenches 144, in the similar manner to the gate electrodes 136 in the third embodiment. The resist layer R16 is then removed.

Figure 46A:
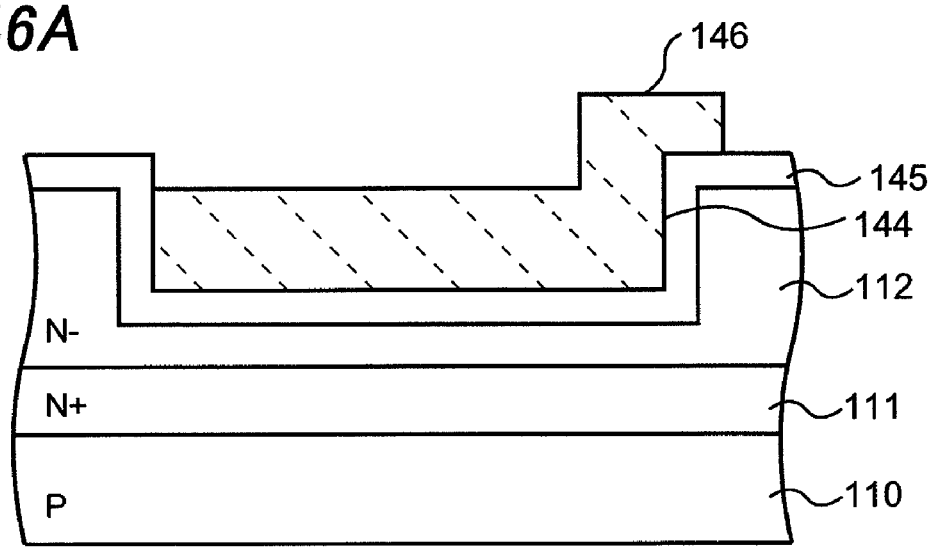
Figure 46B:
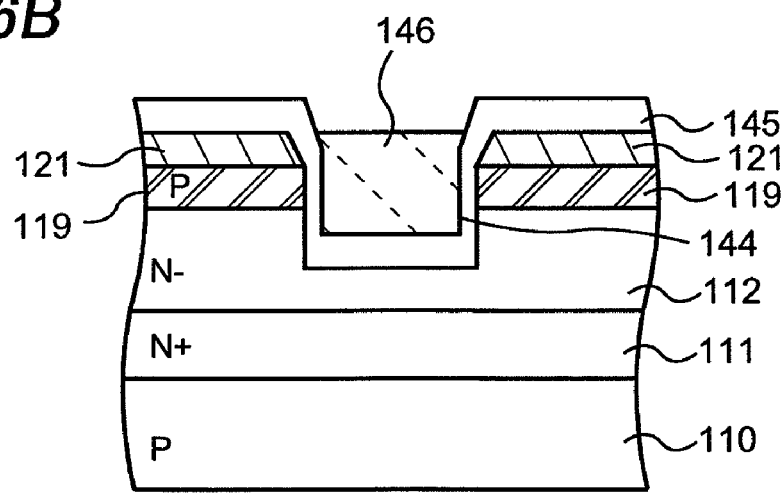
Figure 47A:
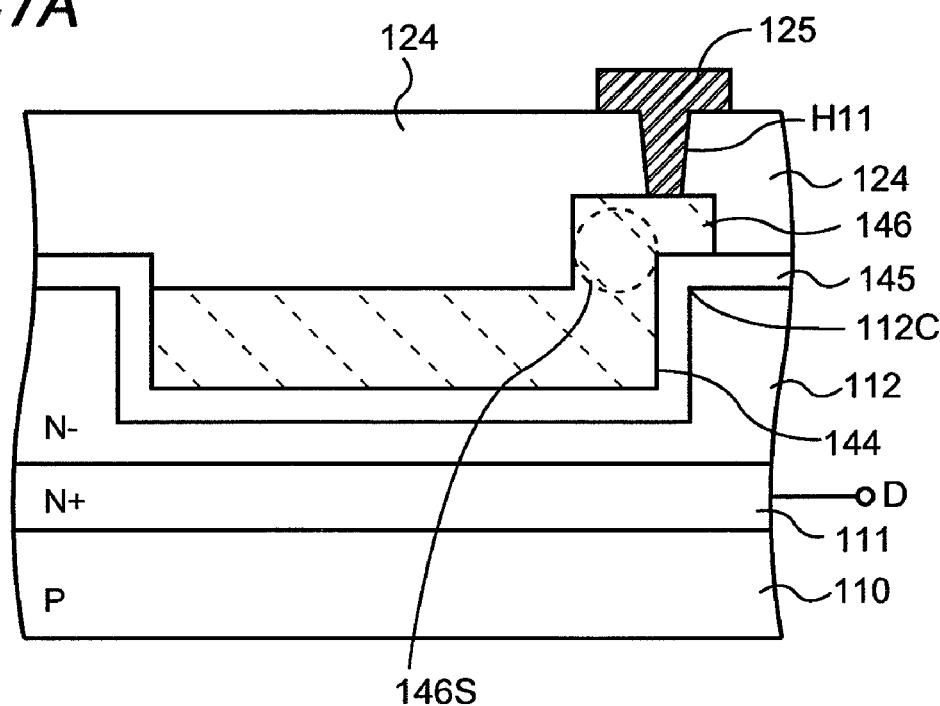
Figure 47B:
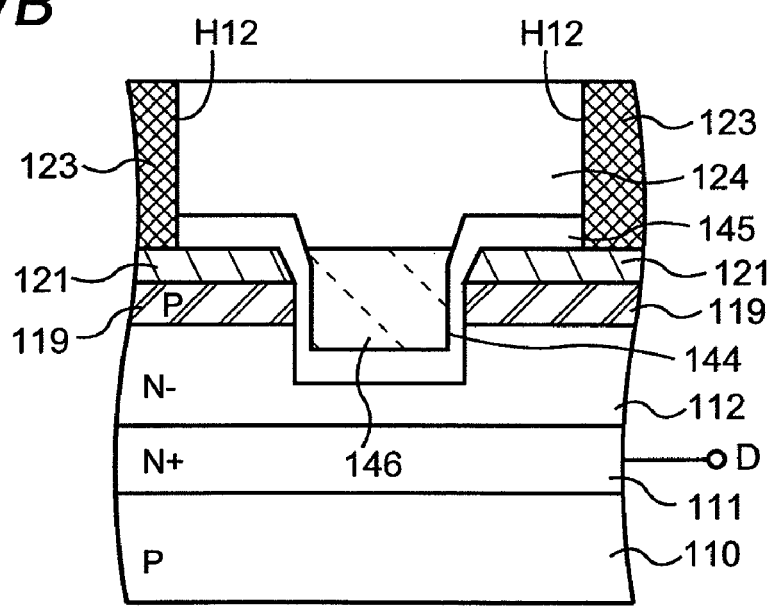
Figure 48:
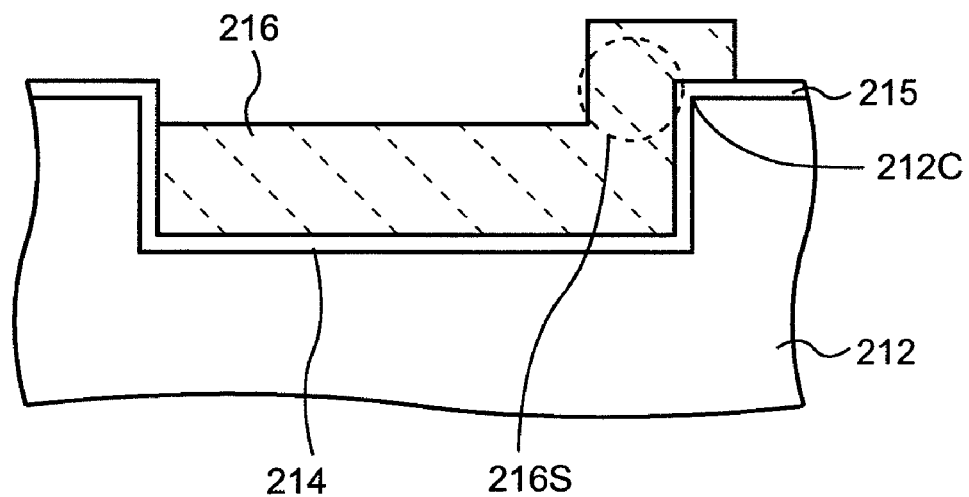
FIG. 48 is a cross-sectional view for explaining a conventional trench gate type transistor and a method of manufacturing the same.

Then, as shown in FIG. 46, in the similar manner to the second embodiment, a body layer 119 and a source layer 121 are formed in the N− type semiconductor layer 112 around each of the trenches 144. Then, as shown in FIG. 47, an interlayer insulation film 124 is formed covering the gate oxide film 145 and the gate electrodes 146. Wiring layers 125 are formed on the interlayer insulation film 124, being connected to the gate electrodes 146 through contact holes H11 provided in the interlayer insulation film 124. Furthermore, source electrodes 123 are formed on the interlayer insulation film 124, being connected to the source layer 121 through contact holes H12 provided in the gate oxide film 145 and the interlayer insulation film 124.

In the transistor thus completed, in the similar manner to the second embodiment, when a potential of the threshold or more is applied from the wiring layers 125 to the gate electrodes 146, the surface of the body layer 119 on the sidewalls of the trenches 144 is inverted into the N type to form channels. Therefore, current flows between the source electrode 123 and the N− type semiconductor layer 112 and the N+ type semiconductor layer 111 as a drain D.

Since the gate oxide film 145 is thick on the sidewalls of the trenches 144 along the short sides, a long distance is provided between the gate electrode 146 at the leading portion 146S and the corner portion 112C of the N− type semiconductor layer 112. Therefore, the gate leakage current is prevented and the gate capacitance (of the gate electrode 146, the gate oxide film 145 and the N− type semiconductor layer 112) is reduced. In the similar manner, since the gate oxide film on the upper portions of the sidewalls of the trenches 144 along the long sides (i.e. near the opening portions of the trenches 144) is thick, too, the gate leakage current is prevented and the gate capacitance is reduced more certainly.

On the other hand, since the gate oxide film 145 on the lower portions of the sidewalls of the trenches 144 along the long sides is relatively thin, the threshold of the transistor is reduced.

As a modification of the embodiment, in the similar manner to that shown in FIG. 27 in the second embodiment, a drain leading portion 126 and a drain electrode 127 may be formed. In this case, before the interlayer insulation film 124 is formed, an opening 112H is formed in the N− type semiconductor layer 112, an insulation film 128 is formed in the opening 112H, and the drain leading portion 126 is embedded therein. Then, the interlayer insulation film 124 is formed, a penetration hole H13 is formed penetrating the interlayer insulation film 124, and the drain electrode 127 is formed in the penetration hole H13, being connected to the drain leading portion 126.

Furthermore, as other modification of the embodiment, the gate electrodes 146 may be formed separately and isolatedly for the trenches 144 respectively in the similar manner to the second embodiment shown in FIG. 28. In this case, too, the same effect as that of the second embodiment is obtained.

The invention is not limited to the above embodiments and modifications are possible within the scope of the invention. For example, although the description is given for an N-channel type transistor, the invention is also applicable to a P-channel type transistor by changing the conductive types of the source layer, the body layer and so on to the opposite conductive types.

Furthermore, the invention is also applicable to a device having an embedded gate electrode such as a trench gate type IGBT.

What is claimed is:

1. A trench gate type transistor comprising:
a semiconductor layer having a trench formed therein;
a gate insulation film disposed in the trench and extending outside the trench so as to overlie a top surface of the semiconductor layer;
a gate electrode disposed on the gate insulation film; and
a body layer formed in the semiconductor layer so as to be in contact with the gate insulation film on a sidewall of the trench,
the gate insulation film comprising a first gate insulation film having a first thickness in a portion in contact with the body layer and a second gate insulation film having a second thickness larger than the first thickness in a portion covering a top edge portion of the trench where the sidewall of the trench and the top surface of the semiconductor layer meet.

2. The trench gate type transistor of claim 1, wherein the second gate insulation film is round at the top edge portion so as not to have an apex portion in a cross section thereof.

3. The trench gate type transistor of claim 1, wherein a high breakdown voltage MOS transistor is formed on the semiconductor layer and comprises another gate insulation film made of the same material as the second gate insulation film.

4. A trench gate type transistor comprising:
a semiconductor layer having a trench formed therein;
a gate insulation film disposed in the trench;
a thick insulation film disposed in an end portion of the trench so as to be in contact with the gate insulation film and having a thickness larger than the gate insulation film;
a gate electrode covering the gate insulation film in the trench and extending onto the thick insulation film; and
a body layer formed in the semiconductor layer along the trench so as to be in contact with the gate insulation film.

5. The trench gate type transistor of claim 4, wherein the thick insulation film comprises a trench insulation film for element isolation.

6. The trench gate type transistor of claim 5, wherein the trench insulation film is deeper than the trench.

7. The trench gate type transistor of claim 4, wherein the thick insulation film comprises a LOCOS oxide film.

8. A trench gate type transistor comprising:
a semiconductor layer comprising a plurality of trenches formed therein;
a gate insulation film formed in the trenches;
a thick insulation film disposed in end portions of the trenches so as to be in contact with the gate insulation film and having a thickness larger than the gate insulation film;
a plurality of gate electrodes, each of the gate electrodes covering the gate insulation film in a corresponding trench and extending onto the thick insulation film; and
a plurality of body layers formed in the semiconductor layer along the trenches so as to be in contact with the gate insulation film,
wherein the gate electrodes are physically separated from each other.

9. The trench gate type transistor of claim 8, wherein the thick insulation film is separated corresponding to the separated gate electrodes.

* * * * *